United States Patent
Cha et al.

(10) Patent No.: US 12,347,949 B2
(45) Date of Patent: Jul. 1, 2025

(54) CONNECTOR AND BOARD CONNECTING ASSEMBLY COMPRISING THE SAME

(71) Applicant: GigaLane Co., Ltd., Hwaseong-si (KR)

(72) Inventors: Sun-hwa Cha, Hwaseong-si (KR);
Young-jo Kim, Hwaseong-si (KR);
Hwa-yoon Song, Hwaseong-si (KR);
Kyung-hun Jung, Hwaseong-si (KR);
Hee-seok Jung, Hwaseong-si (KR)

(73) Assignee: GigaLane Co., Ltd., Hwaseong-si (KR)

( * ) Notice: Subject to any disclaimer, the term of this patent is extended or adjusted under 35 U.S.C. 154(b) by 637 days.

(21) Appl. No.: 17/522,965

(22) Filed: Nov. 10, 2021

(65) Prior Publication Data
US 2022/0200174 A1  Jun. 23, 2022

(30) Foreign Application Priority Data

Dec. 21, 2020 (KR) .................. 10-2020-0179198
Mar. 24, 2021 (KR) .................. 10-2021-0037731

(51) Int. Cl.
*H01R 24/50* (2011.01)
*H01R 12/55* (2011.01)
*H05K 1/18* (2006.01)
*H05K 1/02* (2006.01)

(52) U.S. Cl.
CPC .......... *H01R 12/55* (2013.01); *H05K 1/183* (2013.01); *H05K 1/0237* (2013.01); *H05K 2201/10189* (2013.01)

(58) Field of Classification Search
None
See application file for complete search history.

(56) References Cited

U.S. PATENT DOCUMENTS 4,964,805 A * 10/1990 Gabany .................. H01R 24/50
439/434
5,453,025 A * 9/1995 Wilson .................. H01R 13/41
439/578

(Continued)

FOREIGN PATENT DOCUMENTS

CN    101938057 A    1/2011
CN    107834233 A    3/2018

(Continued)

OTHER PUBLICATIONS

Extended European Search Report dated May 2, 2022.

(Continued)

*Primary Examiner* — Felix O Figueroa
(74) *Attorney, Agent, or Firm* — Shih IP Law Group, PLLC.

(57) ABSTRACT

The present invention provides a connector and a board connecting assembly. The connector according to the present invention includes a connection pin partially inserted into a board to transmit a high-frequency signal, and a dielectric body having a first opening into which the connection pin is inserted, wherein the connection pin includes a central portion, which is disposed in the first opening of the dielectric body, and a first connection portion extending upward from the central portion and protruding upward from the dielectric body, and a diameter of the central portion is greater than that of the first connection portion.

15 Claims, 19 Drawing Sheets

(56) References Cited

U.S. PATENT DOCUMENTS

| | | | | |
|---|---|---|---|---|
| 6,776,668 | B1* | 8/2004 | Scyoc | H01R 24/50 |
| | | | | 439/700 |
| 9,160,121 | B2* | 10/2015 | Wagner | H01R 13/6315 |
| 10,971,846 | B2* | 4/2021 | So | H01R 12/716 |
| 2006/0264076 | A1 | 11/2006 | Chen | |
| 2010/0110056 | A1 | 5/2010 | Kim | |
| 2020/0021049 | A1 | 1/2020 | Song | |
| 2021/0028567 | A1 | 1/2021 | Cha et al. | |

FOREIGN PATENT DOCUMENTS

| | | |
|---|---|---|
| JP | H08-236227 A | 9/1996 |
| JP | 3126892 B2 | 1/2001 |
| KR | 20-0290954 Y1 | 9/2002 |
| KR | 200297074 Y1 | 12/2002 |
| KR | 10-2011-0011035 A | 2/2011 |
| KR | 101926503 B1 | 12/2018 |
| KR | 101974785 B1 | 5/2019 |
| KR | 10-2006134 B1 | 8/2019 |
| KR | 10-2013690 B1 | 8/2019 |
| KR | 102006131 B1 | 8/2019 |
| KR | 10-2019-0140859 A | 12/2019 |
| KR | 10-2118829 B1 | 6/2020 |
| KR | 102163379 B1 | 10/2020 |
| WO | 2019074310 A1 | 4/2019 |
| WO | 2022-139366 A1 | 6/2022 |

OTHER PUBLICATIONS

Office Action for U.S. Appl. No. 18/002,493, dated Mar. 26, 2025.
Chinese Office Action for Application No. 202111176865.X, dated Apr. 23, 2025.

* cited by examiner

CONNECTOR AND BOARD CONNECTING ASSEMBLY COMPRISING THE SAME

CROSS-REFERENCE TO RELATED APPLICATIONS

This application claims the benefit of Korean Patent Application Nos. KR 10-2020-0179198 filed on Dec. 21, 2020 and KR 10-2021-0037731 filed on Mar. 24, 2021, the entire disclosures of which are incorporated herein by reference.

TECHNICAL FIELD

Embodiments of the present invention relate to a connector and a board connecting assembly including the same.

BACKGROUND

In order to increase the data transmission capacity of mobile communication repeaters, multiple-input multiple-output (MIMO) technology using a plurality of antennas is used. As a 5G communication environment and the like are developed, the number of antennas therefore is increased, and thus, the number of connectors therefore is also increased.

Such a connector is partially inserted into a board (for example, a printed circuit board (PCB)), on which signal lines are formed, to be electrically connected to the board, thereby being used for transmission of high-frequency signals.

The connector is implemented with a short height and compactly formed to occupy a small space and also needs to secure high-frequency signal transmission performance.
(Related Art Document 1) Chinese Patent Application Publication No. CN 101938057 A
(Related Art Document 2) US Patent Application Publication No. US 2006/0264076 A1

SUMMARY

The present invention is directed to providing a connector which is compactly formed and also secures high-frequency signal transmission performance, and a board connecting assembly. However, such problems are illustrative only, and the scope of the present invention is not limited thereto.

One aspect of the present invention provides a connector including a connection pin partially inserted into a board to transmit a high-frequency signal, a dielectric body having a first opening into which the connection pin is inserted, and a ground body having a second opening into which the dielectric body is inserted and having a first surface and a second surface, which face each other, having a flat shape, wherein the connection pin includes a central portion, which is disposed in the first opening of the dielectric body, and a first connection portion extending upward from the central portion and protruding upward from the dielectric body, and a diameter of the central portion is greater than that of the first connection portion.

The connection pin may further include a contact portion which has a cross-sectional area that is different from that of the first opening and is supported on a lower surface of the dielectric body.

The connection pin may further include a second connection portion which extends downward from the central portion and protrudes downward from the dielectric body.

The connector may further include a first protrusion disposed on an outer peripheral surface of the central portion and supported on an inner peripheral surface of the dielectric body.

The dielectric body may include a plurality of dielectric holes which pass vertically through the dielectric body and have an open upper surface and an open lower surface or a plurality of dielectric grooves of which at least one of an upper surface and a lower surface is open.

The connector may further include a first supporter which protrudes from an inner peripheral surface of the ground body toward a center of the second opening and supports the dielectric body.

The connection pin may further include a contact portion which has a cross-sectional area that is different from that of the first opening and is supported on a lower surface of the dielectric body, the contact portion may have at least a portion inserted into an accommodation space defined by the first supporter and the dielectric body and may be spaced apart from the first supporter, and a lower surface of the first supporter may be disposed to be coplanar with a lower surface of the contact portion.

The connector may further include a second protrusion disposed on one of an inner peripheral surface of the ground body and an outer peripheral surface of the dielectric body, and a second groove formed in the other of the inner peripheral surface of the ground body and the outer peripheral surface of the dielectric body and coupled to the second protrusion.

The connector may further include a second protrusion disposed on an inner peripheral surface of the ground body and coupled to an outer peripheral surface of the dielectric body in a press-fit manner.

The connector may further include a second protrusion disposed on an inner peripheral surface of the ground body, and a second stepped portion which is disposed on an outer peripheral surface of the dielectric body and on which the second protrusion is seated.

The connector may further include a first protrusion, which is disposed on any one of an inner peripheral surface of the dielectric body and an outer peripheral surface of the connection pin, and a second protrusion disposed on any one of the inner peripheral surface of the ground body and the outer peripheral surface of the dielectric body, wherein the first protrusion and the second protrusion are disposed at different levels.

The connector may further include a joint member which is inserted into the ground body and has a lower surface supporting the dielectric body and the ground body.

The connector may further include at least one mounting portion which is formed on an inner peripheral surface of the ground body and on which a portion of the joint member is seated.

The connector may further include at least one trench which is formed in an outer circumferential surface of the dielectric body and in which another portion of the joint member is seated.

The joint member may be provided as a plurality of joint members of which at least one pair face each other.

The dielectric body may be formed by coupling a plurality of separate dielectric pieces to the connection pin.

The connection pin may further include a contact portion which has a cross-sectional area that is different from that of the first opening and is supported on a lower surface of the dielectric body, and a second supporter which is vertically spaced apart from the contact portion, has a cross-sectional area that is different from that of the first opening, and is supported on an upper surface of the dielectric body.

The dielectric body may further include an accommodation groove for forming a space into which the second supporter is inserted.

Another aspect of the present invention provides a board connecting assembly including a connector including a connection pin which transmits a high-frequency signal and a dielectric body into which the connection pin is inserted, a first board having a plurality of first insertion holes into which the connector is partially inserted, and a fixing board which supports a lower surface of the first board, into which the connector is inserted, and which is coupled to the connector as a ground.

The connector may further include a ground body into which the dielectric body is inserted, and the ground body may include a supporting protrusion disposed on an outer peripheral surface of the ground body and fixed to the fixing board in a press-fit manner.

The connection pin may include a first connection portion inserted into the first insertion hole, wherein the first connection portion is formed to have a diameter that is less than that of the first insertion hole so that the connection pin is fixed to the first board through soldering or an adapter connector, or the first connection portion is formed to have a diameter that is greater than that of the first insertion hole so that the connection pin is fixed to the first board in a press-fit manner.

The connection pin may include a contact portion which has a cross-sectional area that is different from that of the first opening into which the connection pin is inserted at the dielectric body and which is supported on a lower surface of the dielectric body, and the board connecting assembly may further include a board connection connector electrically connected to the contact portion.

The board connecting assembly may further include a second board which is disposed to face the first board and has a second insertion hole into which the connection pin is inserted.

The connection pin may include a second connection portion inserted into the second insertion hole, wherein the second connection portion is formed to have a diameter that is less than that of the second insertion hole so that the connection pin is fixed to the second board through soldering or an adapter connector, or the second connection portion is formed to have a diameter that is greater than that of the second insertion hole so that the connection pin is fixed to the second board in a pres-fit manner.

The board connecting assembly may further include a third protrusion disposed on one of an inner peripheral surface of the fixing board and an outer peripheral surface of the dielectric body, and a third groove formed in the other of the inner peripheral surface of the fixing board and the outer peripheral surface of the dielectric body and coupled to the third protrusion.

The board connecting assembly may further include a third protrusion disposed on an inner peripheral surface of the fixing board, and a third stepped portion which is disposed on an outer peripheral surface of the dielectric body and on which the third protrusion is seated.

The board connecting assembly may further include a first protrusion, which is disposed on any one of an inner peripheral surface of the dielectric body and an outer peripheral surface of the connection pin, and a third protrusion disposed on any one of an inner peripheral surface of the fixing board and an outer peripheral surface of the dielectric body, wherein the first protrusion and the third protrusion are disposed at different levels.

Still another aspect of the present invention provides a connector including a connection pin partially inserted into a board to transmit a high-frequency signal, a dielectric body having a first opening into which the connection pin is inserted, and a ground body into which the dielectric body is inserted, wherein an outer peripheral surface of the ground body has an uneven shape, and the ground body includes a plurality of supporting protrusions forming the uneven shape.

The connection pin may be integrally formed such that a hollow is not formed therein and the connection pin is not separated, the connection pin may include a central portion disposed in the first opening of the dielectric body, and a first connection portion extending upward from the central portion and protruding upward from the dielectric body, a diameter of the central portion may be greater than that of the first connection portion, and the first connection portion may protrude upward from the ground body.

Other aspects, features, and advantages other than those described above will become apparent from the accompanying drawings, the appended claims, and the detailed description of the invention.

Advantageous Effects

According to one embodiment of the present invention configured as described above, a connector and a board connecting assembly can secure high-frequency signal transmission performance and stably transmit high-frequency signals. In addition, the connector can be compactly formed so that the connector and the board connecting assembly can be installed at any place. Of course, the scope of the present invention is not limited by such effects.

BRIEF DESCRIPTION OF DRAWINGS

FIGS. 1A and 1B show perspective views illustrating a connector according to one embodiment of the present invention, wherein FIG. 1A is a perspective view illustrating the connector based on an upper side thereof, and FIG. 1B is a perspective view illustrating the connector based on a lower side thereof.

FIGS. 2A and 2B show perspective views illustrating a connector further including a ground, wherein FIG. 2A is a perspective view illustrating the connector based on an upper side thereof, and FIG. 2B is a perspective view illustrating the connector based on a lower side thereof.

FIGS. 4A and 4B show perspective views illustrating a connector further including a second connection portion, wherein FIG. 4A is a perspective view illustrating the connector based on an upper side thereof, and FIG. 4B is a perspective view illustrating the connector based on a lower side thereof.

FIGS. 5A and 5B show perspective views illustrating a connector further including a second connection portion and a ground body, wherein FIG. 5A is a perspective view illustrating the connector based on an upper side thereof, and FIG. 5B is a perspective view illustrating the connector based on a lower side thereof.

FIGS. 17A-17C and 18A-18C are views illustrating a connector further including a joint member, wherein FIGS. 17A and 18A are perspective views, FIGS. 17B and 18B are exploded perspective views, and FIGS. 17C and 18C are exploded cross-sectional views.

FIGS. 19A-19C and 20A-20C are views illustrating a connector further including a joint member, in which a dielectric body is formed by coupling a plurality of dielectric pieces, wherein FIGS. 19A and 20A are perspective views, FIGS. 19B and 20B are exploded perspective views of the dielectric body, and FIGS. 19C and 20C are exploded cross-sectional views.

DETAILED DESCRIPTION

Figure 1A:
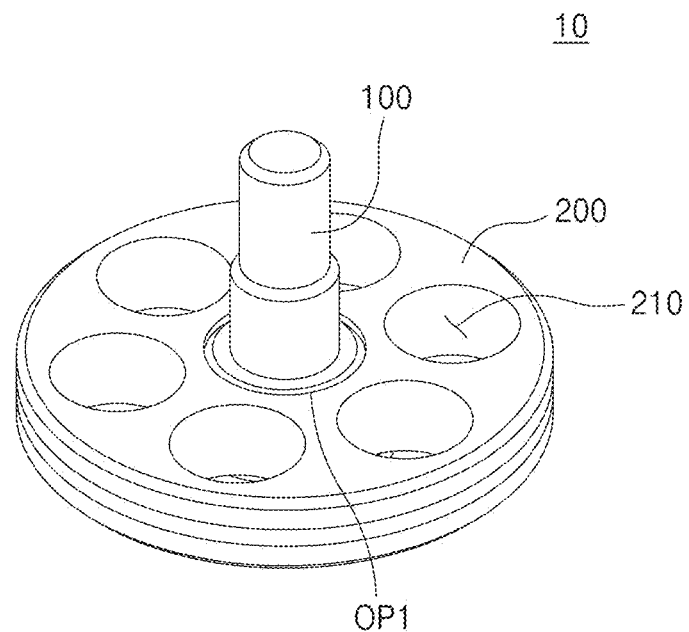
Figure 1B:
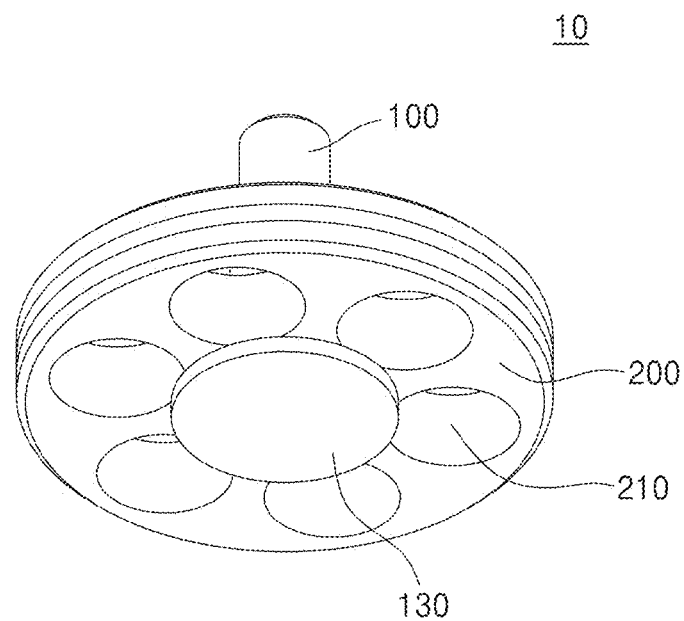

Since the present invention will be changed in various ways and have various embodiments, specific embodiments will be illustrated in the accompanying drawings and described in detail in the following description. However, the present invention is not limited to the embodiments disclosed below and may be implemented in various forms.

In the following embodiments, a singular form may include a plural form unless there is no clearly opposite meaning in the context.

In the accompanying drawings, elements may be exaggerated or reduced in size for convenience of explanation. For example, the sizes and thicknesses of the respective elements shown in the drawings are arbitrarily shown for convenience of description, and thus the present invention is not necessarily limited to the illustrated configurations.

In the following embodiments, it will be understood that, when an element is referred to as being "connected" to another element, the element may be "directly connected" to another element or may be "indirectly connected" to another element with other elements component interposed therebetween.

Hereinafter, a connector 10 according to an aspect of the present invention will be mainly described.

Referring to FIGS. 1A, 1B, 2A, 2B, 3, 4A, 4B, 5A, 5B, and 6, the connector 10 may include a connection pin 100 and a dielectric body 200 and may optionally further include a ground body 300.

The connection pin 100 may be partially inserted into a board to transmit high-frequency signals. For example, referring to FIGS. 21 and 22, the connection pin 100 may be partially inserted into a first board PB1 of a board connecting assembly 20 to be described below and electrically connected to signal lines (not shown) of the first board PB1. In addition, referring to FIGS. 23 and 24, the connection pin 100 may be partially inserted into a second board PB2 of the board connecting assembly 20 to be described below and electrically connected to signal lines (not shown) of the second board PB2.

A material of the connection pin 100 may be formed of a metal material having electrical conductivity. For example, the material of the connection pin 100 may include at least one selected from among copper, brass, and beryllium copper (BeCu).

A hollow may not be formed inside the connection pin 100. In addition, the connection pin 100 may be integrally formed to not be separated. For example, the connection pin 100 may be formed through cutting work.

As described above, the connection pin 100 is integrally formed so that the hollow is not formed therein, thereby securing high-frequency signal transmission performance.

Figure 3:
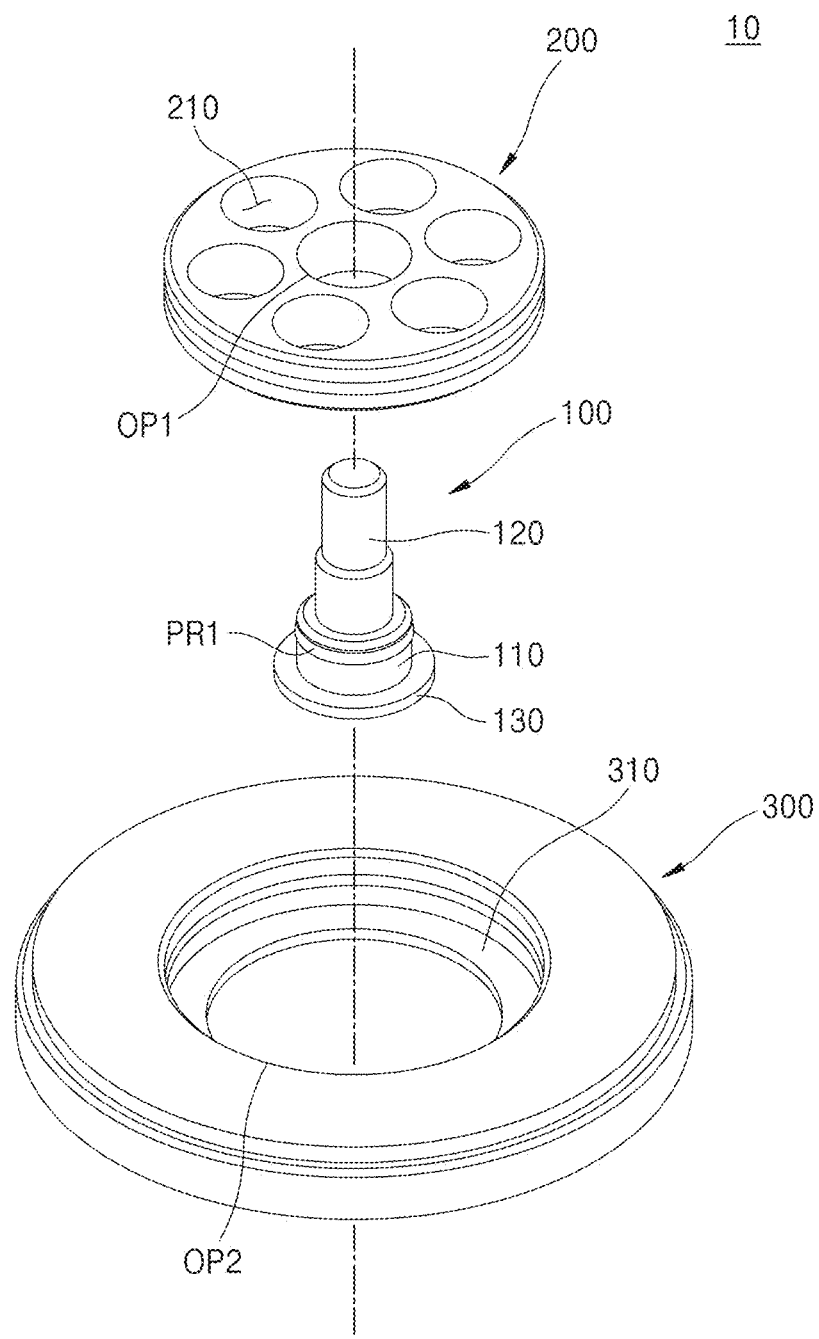
FIG. 3 is an exploded perspective view of the connector of FIG. 2.
Figure 4A:
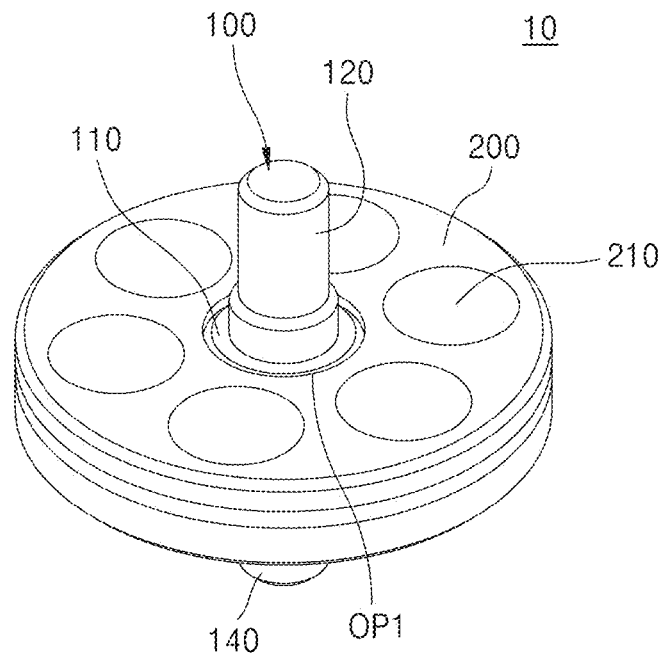
Figure 4B:
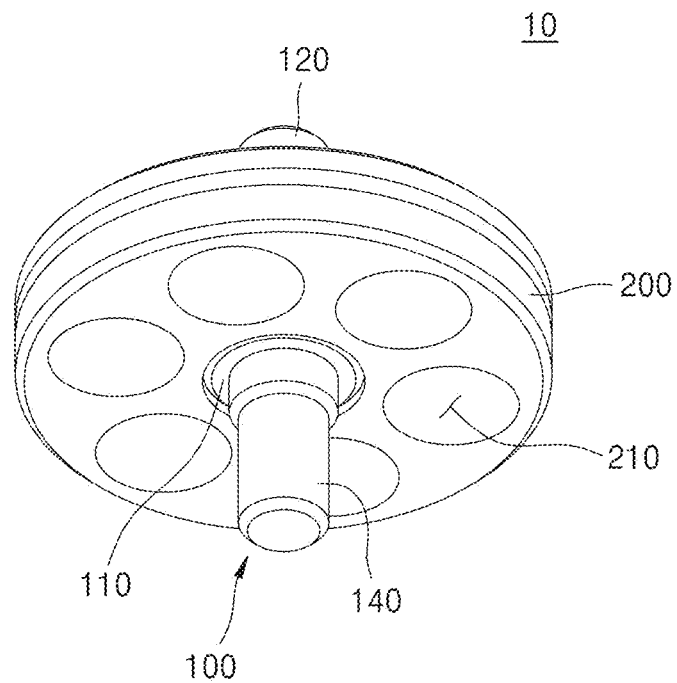
Figure 5A:
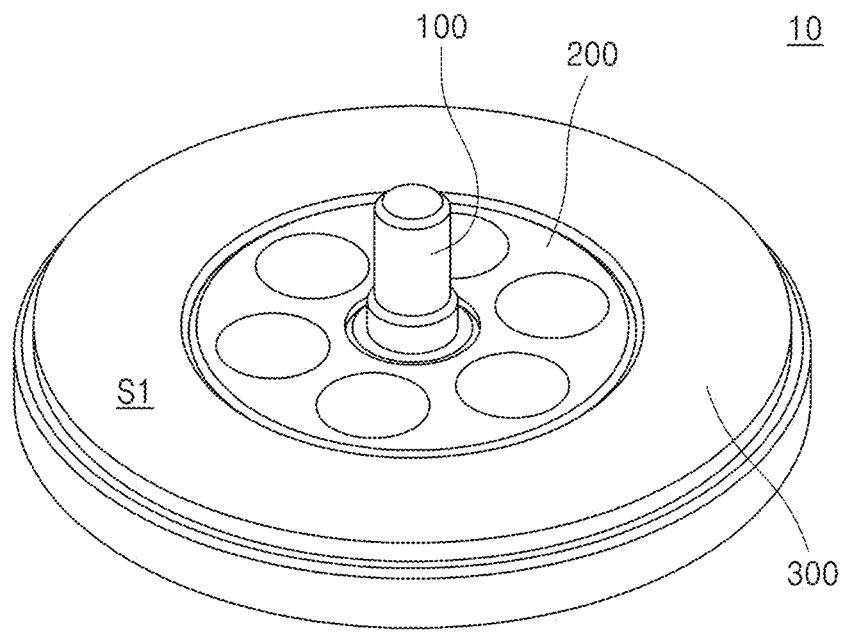
Figure 5B:
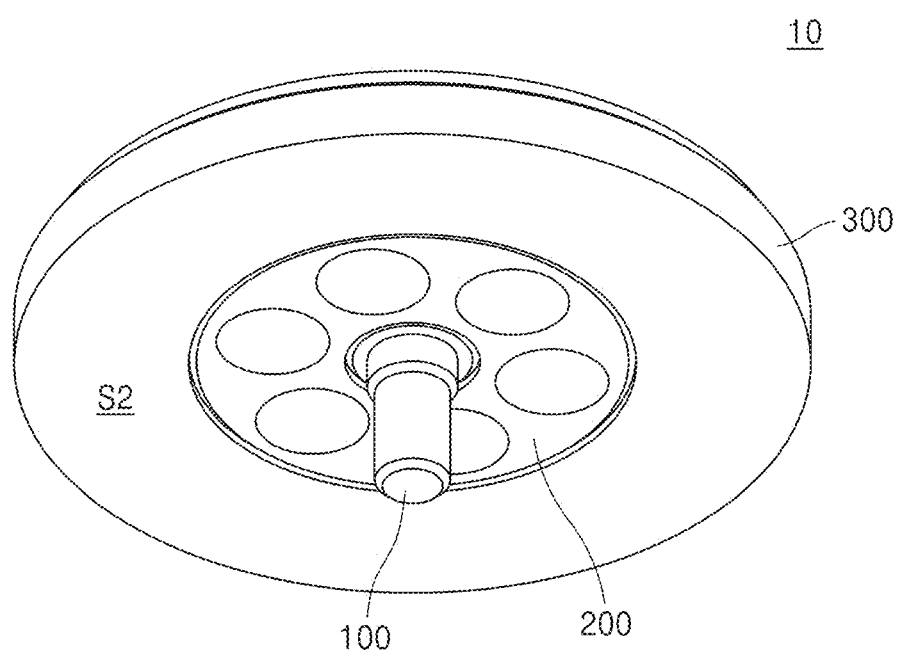
Figure 6:
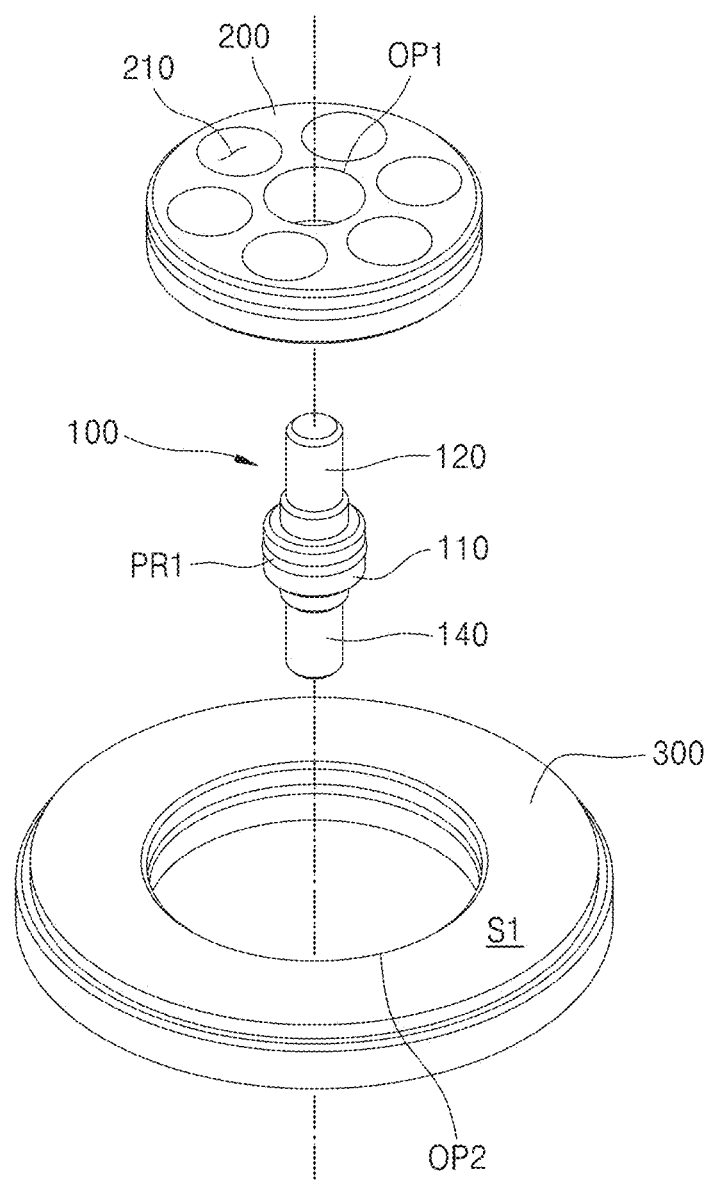
FIG. 6 is an exploded perspective view of the connector of FIG. 5.

Referring to FIGS. 3 and 6, the connection pin 100 may be inserted into the dielectric body 200.

The dielectric body 200 may electrically insulate the connection pin 100 from a ground. For example, the ground may be the ground body 300 or a fixing board FM which will be described below.

The dielectric body 200 may have a first opening OP1 into which the connection pin 100 is inserted. For example, the connection pin 100 may be inserted into the first opening OP1 and coupled to the dielectric body 200.

A material of the dielectric body 200 may be formed of a heat-resistant material having heat resistance among insulating materials having an electrical insulating property. For example, the material of the dielectric body 200 may include at least one selected from among polytetrafluoroethylene (PTFE), a liquid crystal polymer (LCP), polyetheretherketone (PEEK), and Ultem.

As such, when a shape of the dielectric body 200 is deformed due to heat applied to the connector 10 due to soldering or the like in a process of coupling the connector 10 to the board connecting assembly 20, a position of the connection pin 100 inserted into the dielectric body 200 may be changed, thereby degrading high-frequency signal transmission performance.

However, since the material of the dielectric body 200 is formed of a heat-resistant material among insulating materials, the connection pin 100 may be electrically insulated from the ground, and thermal deformation of the dielectric body 200 may be minimized, thereby securing high-frequency signal transmission performance.

Referring to FIGS. 3 and 6, the connection pin 100 may include a central portion 110 and a first connection portion 120 and may optionally further include a contact portion 130 or a second connection portion 140.

The central portion 110 of the connection pin 100 may be disposed in the first opening OP1 of the dielectric body 200. For example, the central portion 110 may be inserted into the first opening OP1 of the dielectric body 200 so that the connection pin 100 may be coupled to the dielectric body 200.

Figure 22:
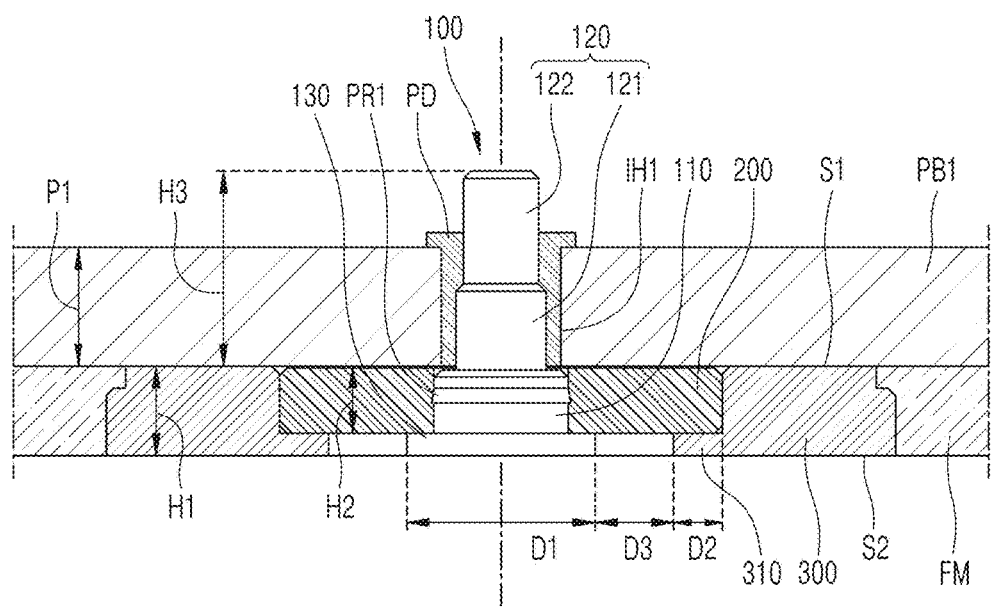
FIG. 22 is an enlarged view illustrating portion 22-22 of FIG. 21.
Figure 24:
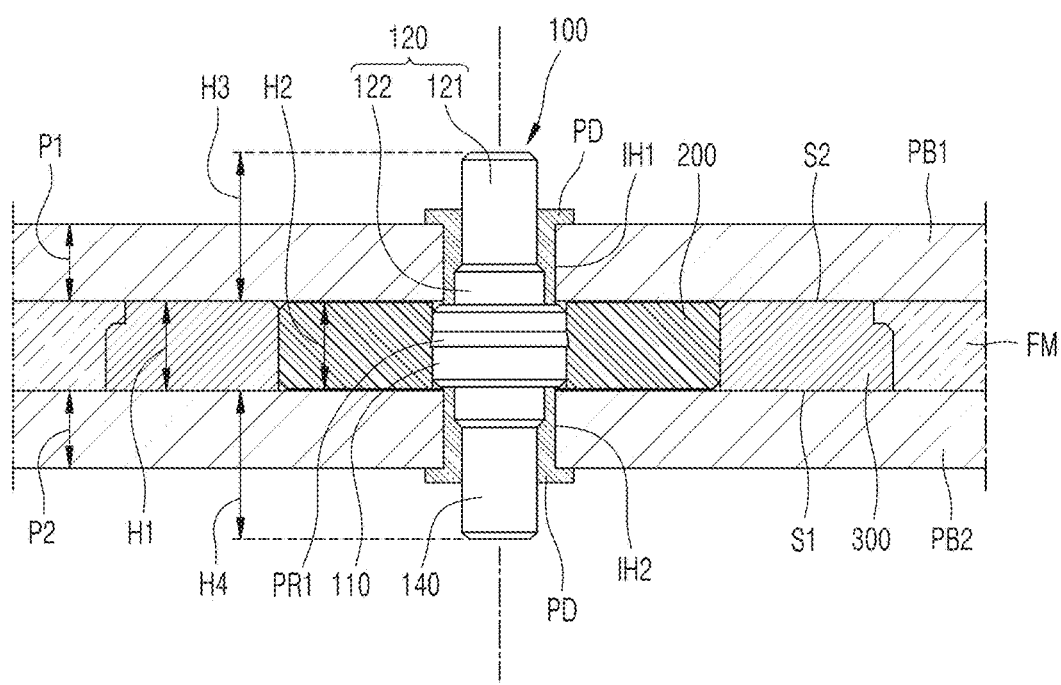
FIG. 24 is an enlarged view illustrating portion 24-24 of FIG. 23.

Referring to FIGS. 22 and 24, a height of the central portion 110 may be less than or equal to a second height H2 of the dielectric body 200.

The first connection portion 120 may extend upward from the central portion 110 and may protrude upward from the dielectric body 200. For example, referring to FIGS. 21 and 22, the first connection portion 120 may be partially inserted into the first board PB1 of the board connecting assembly 20 to be described below and electrically connected to the signal lines (not shown) of the first board PB1.

The central portion 110 may be formed to have a diameter that is greater than that of the first connection portion 120.

As such, since external signal interference to the central portion 110 is increased, signal transmission performance may be degraded.

However, the central portion 110 may be formed to have the diameter that is greater than that of the first connection portion 120, thereby improving a coupling between the central portion 110 and the dielectric body 200 and securing high-frequency signal transmission performance in the central portion 110.

The connection pin 100 may further include the contact portion 130 or the second connection portion 140.

First, referring to FIGS. 1A, 1B, 2A, 2B, and 3, the connection pin 100 may further include the contact portion 130.

The contact portion 130 may extend downward from the central portion 110 and may protrude downward from the dielectric body 200. For example, the contact portion 130 may be disposed at a side opposite to the first connection portion 120.

The contact portion 130 may have a cross-sectional area that is different from that of the first opening OP1 and may support a lower surface of the dielectric body 200. For example, since the contact portion 130 has a cross-sectional area that is greater than that of the first opening OP1, an edge of the contact portion 130 may extend from the first opening OP1 so as to support the dielectric body 200.

As described above, since the contact portion 130 having the cross-sectional area that is different from that of the first opening OP1 supports the lower surface of the dielectric body 200, a coupling between the contact portion 130 and the dielectric body 200 may be improved.

Figure 21:
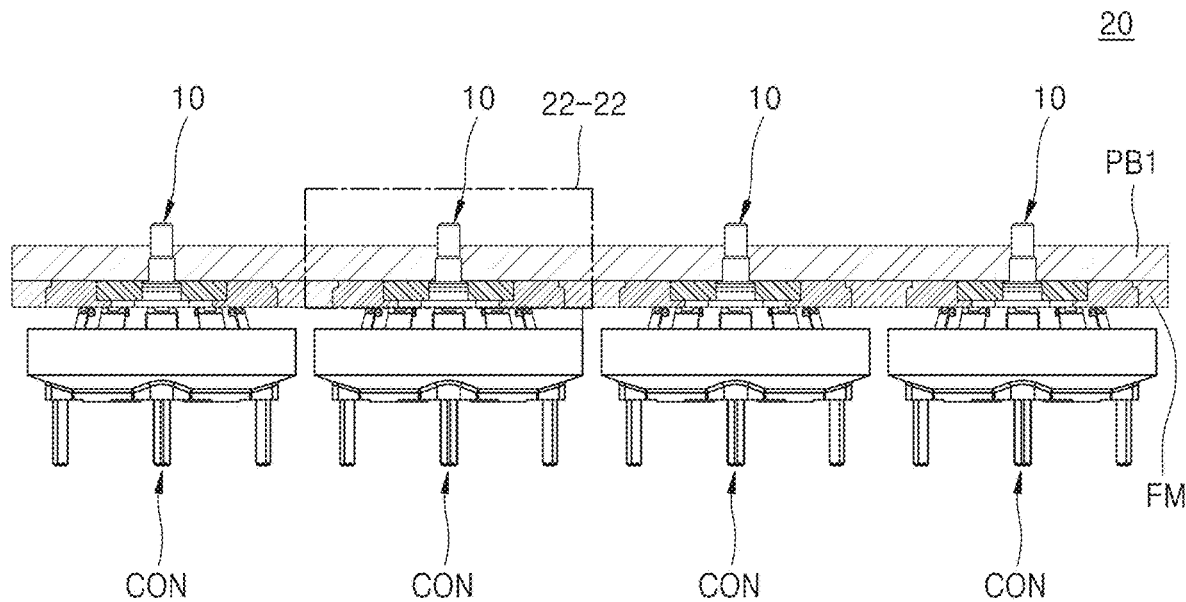
FIG. 21 is a cross-sectional view illustrating a board connecting assembly according to another embodiment of the present invention.
Figure 25:
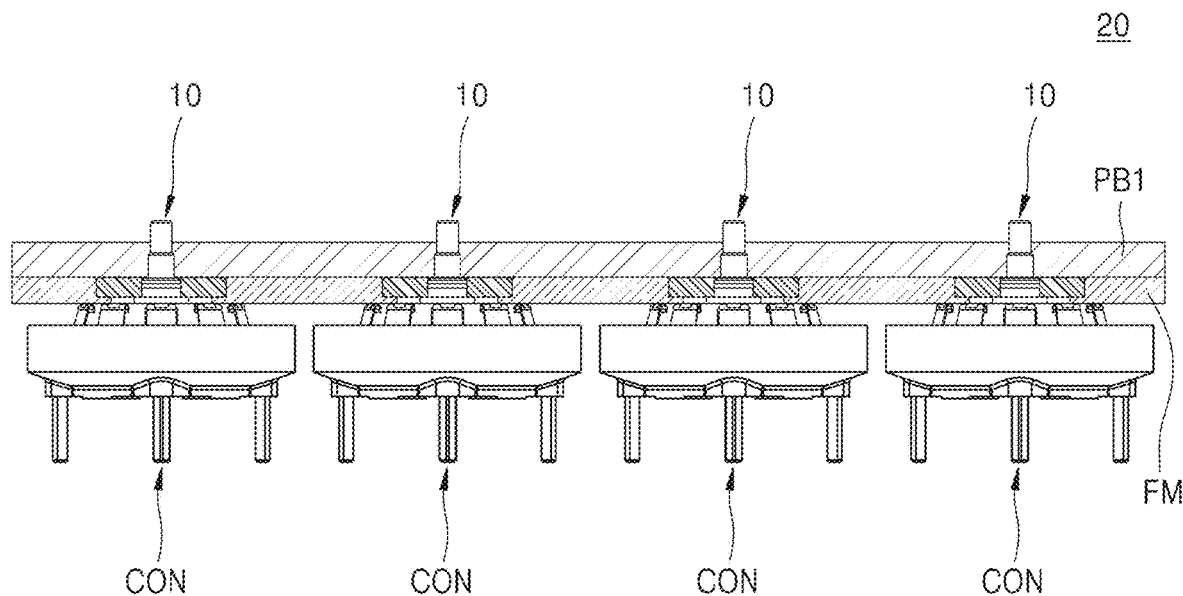
FIGS. 25 and 26 are cross-sectional views illustrating a board connecting assembly in which a dielectric body is in direct contact with a fixing board.

Referring to FIGS. 21 and 25, a board connection connector CON to be described below may be in contact with and electrically connected to the contact portion 130.

A lower surface of the contact portion 130 may have a flat shape.

As described above, since the lower surface of the contact portion 130 has the flat shape, the contact portion 130 and the board connection connector CON may maintain a stable contact.

Next, referring to FIGS. 4A, 4B, 5A, 5B, and 6, the connection pin 100 may further include the second connection portion 140 instead of the contact portion 130 described above.

The second connection portion 140 may extend downward from the central portion 110 and may protrude downward from the dielectric body 200. For example, the second connection portion 140 may be disposed at a side opposite to the first connection portion 120.

Figure 23:
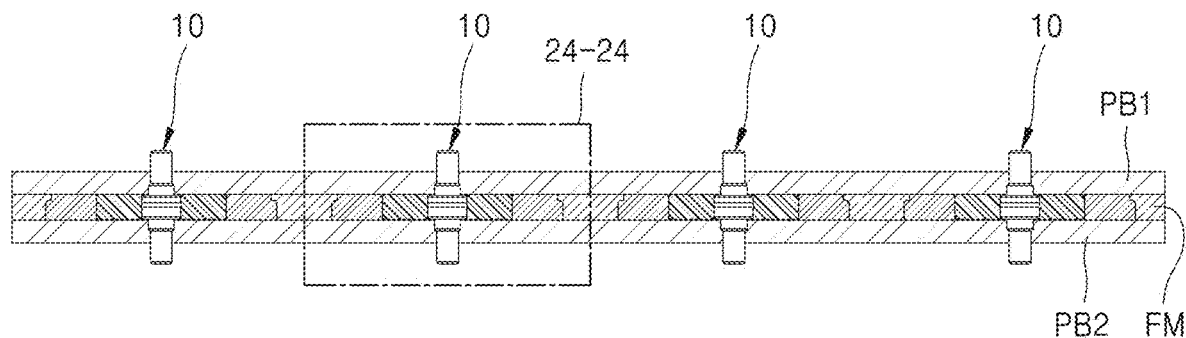
FIG. 23 is a cross-sectional view illustrating a board connecting assembly further including a second connection portion.

Referring to FIGS. 23 and 24, the second connection portion 140 may be partially inserted into the second board PB2 of the board connecting assembly 20 to be described below and electrically connected to the signal lines (not shown) of the second board PB2.

The central portion 110 may be formed to have a diameter that is greater than that of the second connection portion 140.

The diameter of the second connection portion 140 may be the same as the diameter of the first connection portion 120.

As such, since external signal interference to the central portion 110 is increased, signal transmission performance may be degraded.

However, the central portion 110 is formed to have the diameter that is greater than that of the second connection portion 140, thereby improving a coupling between the central portion 110 and the dielectric body 200 and securing high-frequency signal transmission performance in the central portion 110.

Referring to FIGS. 3, 6, 22, and 24, the connection pin 100 may further include a first protrusion PR1.

The first protrusion PR1 may be disposed on an outer peripheral surface of the central portion 110. The first protrusion PR1 may be supported on an inner peripheral surface of the dielectric body 200. For example, when the connection pin 100 is coupled to the dielectric body 200, the first protrusion PR1 may be fixedly inserted into the inner peripheral surface of the dielectric body 200.

Referring to FIGS. 3 and 6, although the first protrusion PR1 is illustrated as having a shape that surrounds the outer peripheral surface of the central portion 110, but the present invention is not limited thereto, and a plurality of first protrusions (not shown) may be disposed on the outer peripheral surface of the central portion 110.

Although not shown in the drawings, between the connection pin 100 and the dielectric body 200, a coupling structure using the first protrusion PR1 and a first groove (not shown) may be formed, a coupling structure using the first protrusion PR1 and the dielectric body 200 may be formed, or a coupling structure using the first protrusion PR1 and a first stepped portion (not shown) may be formed.

Various embodiments of the coupling structure of the first protrusion PR1 are as follows.

In one embodiment, the coupling structure using the first protrusion PR1 and the first groove (not shown) may be a structure in which the first protrusion PR1 is disposed on one of an outer peripheral surface of the connection pin 100 and the inner peripheral surface of the dielectric body 200 and the first groove (not shown) is formed in the other of the outer peripheral surface of the connection pin 100 and the inner peripheral surface of the dielectric body 200 so that the first protrusion PR1 and the first groove (not shown) are coupled.

In another embodiment, the coupling structure using the first protrusion PR1 and the dielectric body 200 may be a structure in which the first protrusion PR1 is disposed on the outer peripheral surface of the connection pin 100 and coupled to the inner peripheral surface of the dielectric body 200 in a press-fit manner.

In still another embodiment, the coupling structure using the first protrusion PR1 and the first stepped portion (not shown) may be a structure in which the first protrusion PR1 is disposed on the outer peripheral surface of the connection pin 100 and the first stepped portion (not shown) is disposed on the inner peripheral surface of the dielectric body 200 so that the first protrusion PR1 is seated on the first stepped portion (not shown).

The coupling structure of the first protrusion (not shown) is different from a coupling structure of a second protrusion PR2 of FIGS. 8 to 17C to be described below only in a disposed component and is similar thereto in a shape, and thus, detailed descriptions thereof will be omitted.

As described above, since the coupling structure of the first protrusion PR1 is formed, the connection pin 100 and the dielectric body 200 may stably maintain a coupled state.

Referring to FIGS. 1A, 1B, 2A, 2B, 3, 4A, 4B, 5A, 5B, and 6, the dielectric body 200 may further include at least one of dielectric holes 210 and dielectric grooves (not shown).

First, the dielectric body 200 may include the plurality of dielectric holes 210 which pass vertically through the dielectric body 200 and have an open upper surface and an open lower surface. For example, the plurality of dielectric holes 210 may be radially formed outside the first opening OP1.

The dielectric hole 210 may have a preset open area. For example, a cross-sectional area of one dielectric hole 210 may be smaller than a cross-sectional area of the first opening OP1.

Next, the dielectric body 200 may include the plurality of dielectric grooves (not shown) of which at least one of an upper surface and a lower surface is open. For example, the plurality of dielectric grooves may be radially formed outside the first opening OP1.

The plurality of dielectric grooves (not shown) in the same surface of the dielectric body 200 may be open. Alternatively, some of the plurality of dielectric grooves (not shown) in an upper surface of the dielectric body 200 may be open, and the others of the plurality of dielectric grooves (not shown) in a lower surface of the dielectric body 200 may be open.

The dielectric groove (not shown) may have a preset open area. For example, a cross-sectional area of one dielectric groove (not shown) may be smaller than the cross-sectional area of the first opening OP1.

Next, the dielectric body 200 may include both the plurality of dielectric holes 210 and the plurality of dielectric grooves (not shown). For example, the dielectric holes 210 may be formed in one portion of the dielectric body 200, and the dielectric grooves (not shown) may be formed in the other portion thereof.

When the dielectric body 200 includes at least one of the dielectric hole 210 and the dielectric groove (not shown), permittivity of the dielectric body 200 may be lowered so that a diameter of the connection pin 100 may be formed great. For example, the diameter of the central portion 110 may be formed great.

When heat is applied to the dielectric body 200, the dielectric body 200 expands outward, and the dielectric hole 210 or the dielectric groove (not shown) may form an available space for expansion inside the dielectric body 200, and thus, the dielectric body 200 may expand inward instead of outward.

As described above, the diameter of the connection pin 100 may be formed great, thereby securing the high-frequency signal transmission performance of the connector 10. In addition, the available space for expansion is formed inside the dielectric body 200, thereby minimizing the thermal deformation of the dielectric body 200.

Referring to FIGS. 2A, 2B, 3, 5A, 5B, and 6, the connector 10 may further include the ground body 300.

The ground body 300 may have a second opening OP2 into which the dielectric body 200 is inserted. For example, the dielectric body 200 may be inserted into the second opening OP2 and coupled to the ground body 300.

The ground body 300 may block external signal interference to the connection pin 100.

The ground body 300 may be formed of a metal material having electrical conductivity. For example, the ground body 300 may be formed of copper, brass, beryllium copper (BeCu), or the like.

The ground body 300 may have a first surface S1 and a second surface S2, which face each other, having a flat shape.

Figure 8:
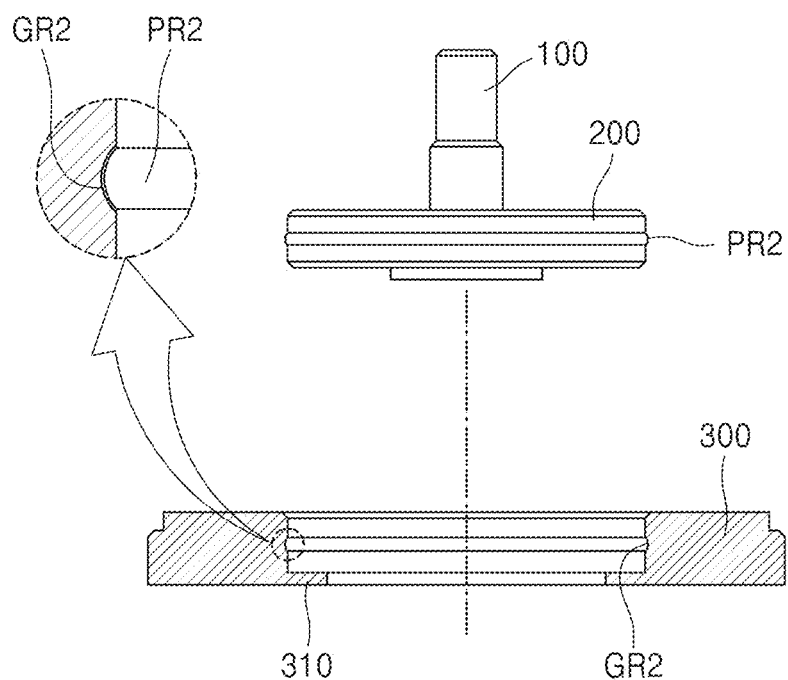
Figure 10:
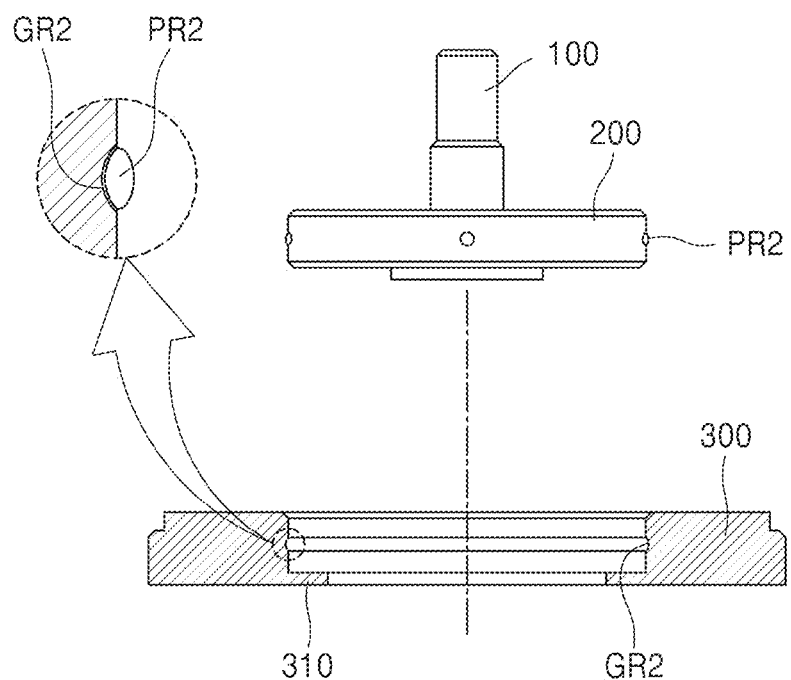

Referring to FIGS. 8 and 10, the first surface S1 may be supported on a lower surface of the first board PB1 to be described below.

The second surface S2 may be in contact with the board connection connector CON to be described below or may support an upper surface of the second board PB2 to be described below.

Various embodiments of the second surface S2 are as follows.

In one embodiment, referring to FIGS. 21 and 22, the second surface S2 may be positioned to be coplanar with a lower surface of the contact portion 130.

The second surface S2 and the lower surface of the contact portion 130 may be in contact with the board connection connector CON to be described below.

In another embodiment, referring to FIGS. 23 and 24, the second surface S2 may support the upper surface of the second board PB2 to be described below.

As described above, the ground body 300 is coupled to the dielectric body 200, thereby securing the high-frequency signal transmission performance of the connector 10.

Figure 2A:
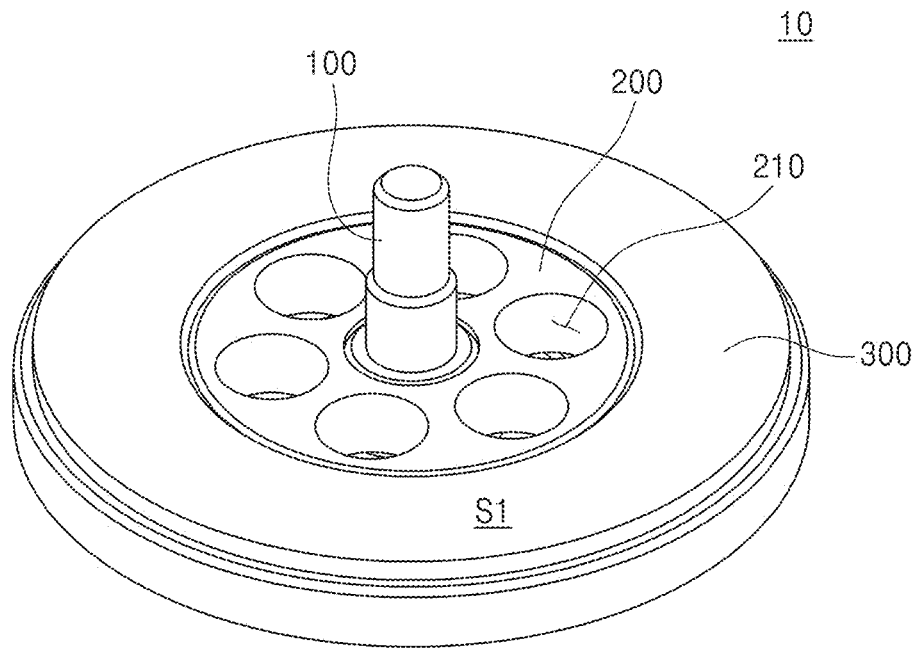
Figure 2B:
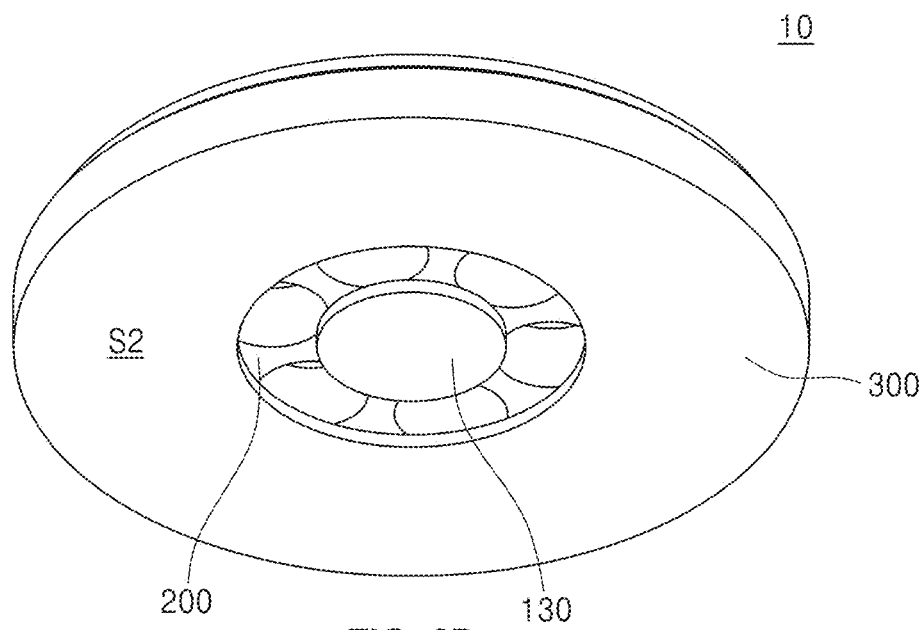

Referring to FIGS. 2A, 2B, and 3, the connector 10 may further include a first supporter 310 protruding from an inner peripheral surface of the ground body 300 toward a center of the second opening OP2.

The first supporter 310 may support the dielectric body 200.

Referring to FIG. 22, at least a portion of the contact portion 130 may be inserted into an accommodation space defined by the first supporter 310 and the dielectric body 200.

The first supporter 310 may be disposed to be spaced apart from the contact portion 130.

As such, since external signal interference to the contact portion 130 is increased, signal transmission performance may be degraded.

However, the first supporter 310 is closer to the contact portion 130 than the ground body 300 to block external signal interference to the contact portion 130, thereby securing high-frequency signal transmission performance.

Referring to FIG. 22, the contact portion 130 may have a preset first diameter D1, the first supporter 310 may protrude inward from the second opening OP2 by a protrusion distance of a second diameter D2, the contact portion 130 and the first supporter 310 may be spaced apart from each other by a third diameter D3, and the dielectric body 200 may be exposed through a spacing space between the contact portion 130 and the first supporter 310.

Referring to FIG. 22, a lower surface of the first supporter 310 may be positioned to be coplanar with the lower surface of the contact portion 130.

The lower surface of the first supporter 310 and the lower surface of the contact portion 130 may have a flat shape.

A height of the first supporter 310 may be the same as a height of the contact portion 130.

As described above, since the first supporter 310 is disposed around the contact portion 130, the dielectric body 200 may be stably disposed in an inner space of the ground body 300, and external signal interference may be blocked. Thus, the connector 10 can stably transmit high-frequency signals.

Referring to FIGS. 7 to 14, in the ground body 300 and the dielectric body 200, a coupling structure using the second protrusion PR2 and a second groove GR2 may be formed, a coupling structure using the second protrusion PR2 and the dielectric body 200 may be formed, or a coupling structure using the second protrusion PR2 and a second stepped portion ST2 may be formed.

First, the coupling structure using the second protrusion PR2 and the second groove GR2 may be a structure in which the second protrusion PR2 is disposed on one of the inner peripheral surface of the ground body 300 and an outer peripheral surface of the dielectric body 200, and the second groove GR2 is formed in the other of the inner peripheral surface of the ground body 300 and the outer peripheral surface of the dielectric body 200 so that the second protrusion PR2 and the second groove GR2 are coupled.

Various embodiments of the second protrusion PR2 and the second groove GR2 are as follows.

Figure 7:
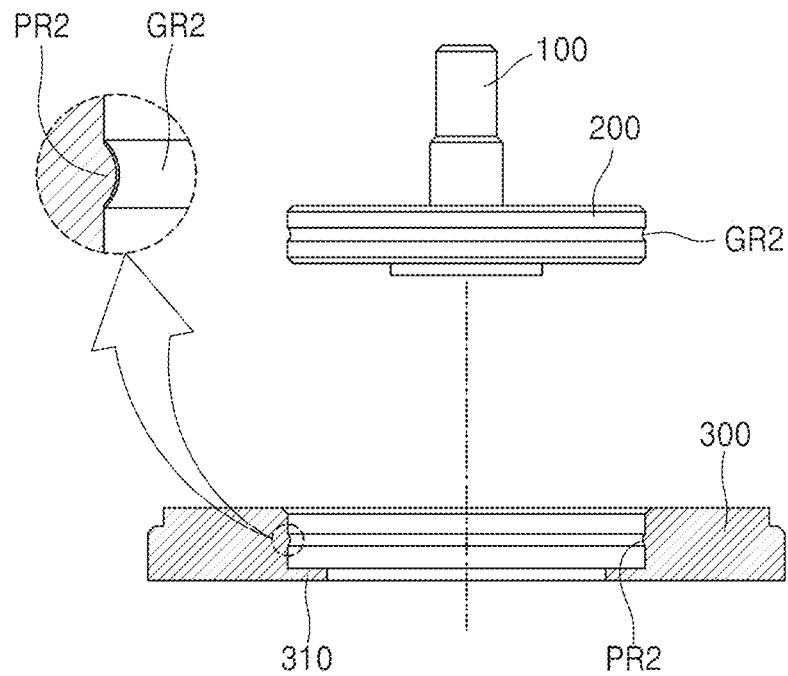
FIGS. 7 to 16 are views illustrating a connector further including a second protrusion.

In one embodiment, referring to FIG. 7, the connector 10 may include the second protrusion PR2 and the second groove GR2.

The second protrusion PR2 may be disposed on the inner peripheral surface of the ground body 300.

The second groove GR2 may be formed to extend to a predetermined depth along the outer peripheral surface of the dielectric body 200.

The second protrusion PR2 may extend along the second groove GR2 and be inserted into and coupled to the second groove GR2.

The second groove GR2 may have a shape corresponding to the second protrusion PR2. Alternatively, although not shown in the drawings, the second groove GR2 may be formed in a shape that is greater than that of the second protrusion PR2 to have an available space, thereby accommodating the second protrusion PR2.

Meanwhile, referring to FIG. 8, the second protrusion PR2 may be disposed on the outer peripheral surface of the dielectric body 200 instead of the second groove GR2, and the second groove GR2 may be formed in the inner peripheral surface of the ground body 300 instead of the second protrusion PR2.

Such a coupling structure using the second protrusion PR2 and the second groove GR2 of FIG. 8 is different from that of FIG. 7 only in an arrangement position, and thus, detailed descriptions thereof will be omitted.

Figure 9:
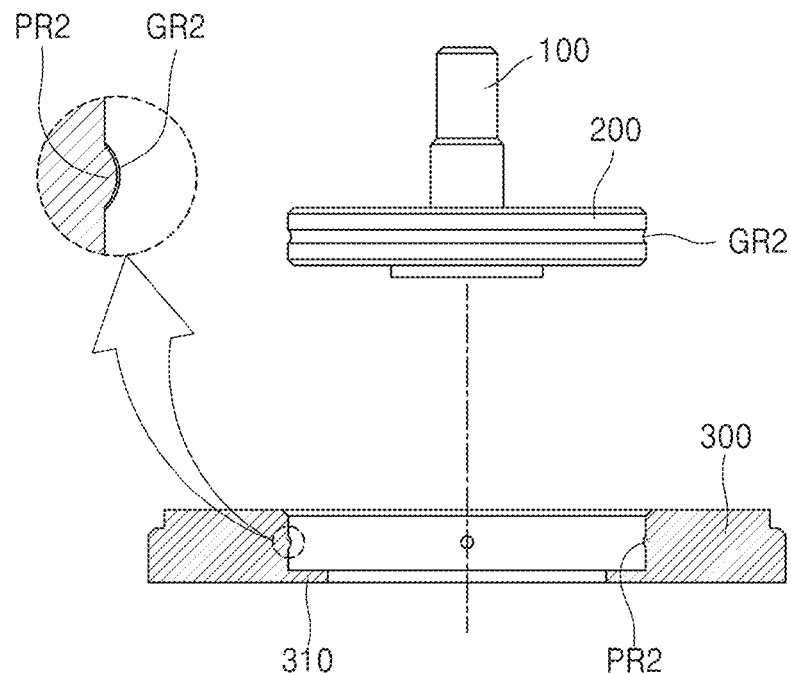

In another embodiment, referring to FIG. 9, the connector 10 may include the second protrusion PR2 and the second groove GR2.

The second protrusion PR2 may be disposed on the inner peripheral surface of the ground body 300.

The second groove GR2 may be formed to extend to a predetermined depth along the outer peripheral surface of the dielectric body 200.

A plurality of second protrusions PR2 may be disposed to be spaced apart from each other and may be inserted into and coupled to the second groove GR2.

The second groove GR2 may have a shape corresponding to the second protrusion PR2 or may have a shape that has an available space to accommodate the second protrusion PR2.

Meanwhile, referring to FIG. 10, the second protrusion PR2 may be disposed on the outer peripheral surface of the dielectric body 200 instead of the second groove GR2, and the second groove GR2 may be formed in the inner peripheral surface of the ground body 300 instead of the second protrusion PR2.

Such a coupling structure using the second protrusion PR2 and the second groove GR2 of FIG. 10 is different from that of FIG. 9 only in an arrangement position, and thus, detailed descriptions thereof will be omitted.

Figure 11:
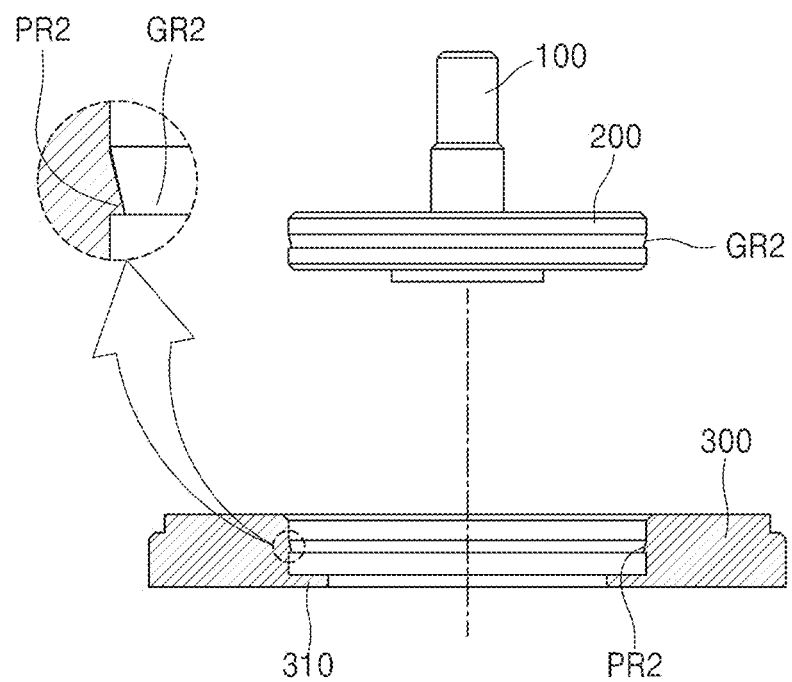

In still another embodiment, referring to FIG. 11, the connector 10 may include the second protrusion PR2 and the second groove GR2.

The second protrusion PR2 may be disposed on the inner peripheral surface of the ground body 300.

The second groove GR2 may be formed to extend to a predetermined depth along the outer peripheral surface of the dielectric body 200.

The second protrusion PR2 may extend along the second groove GR2 so that an inclined surface is formed and may be inserted into and coupled to the second groove GR2.

The second groove GR2 may have a shape corresponding to the second protrusion PR2 or may have a shape that has an available space to accommodate the second protrusion PR2.

For example, since the dielectric body 200 slides along the inclined surface of the second protrusion PR2 to be inserted into the second opening OP2 of the ground body 300, the dielectric body 200 is smoothly inserted into the second opening OP2 of the ground body 300, and the second protrusion PR2 is caught in the second groove GR2, thereby preventing the dielectric body 200 from being separated from the ground body 300.

Figure 12:
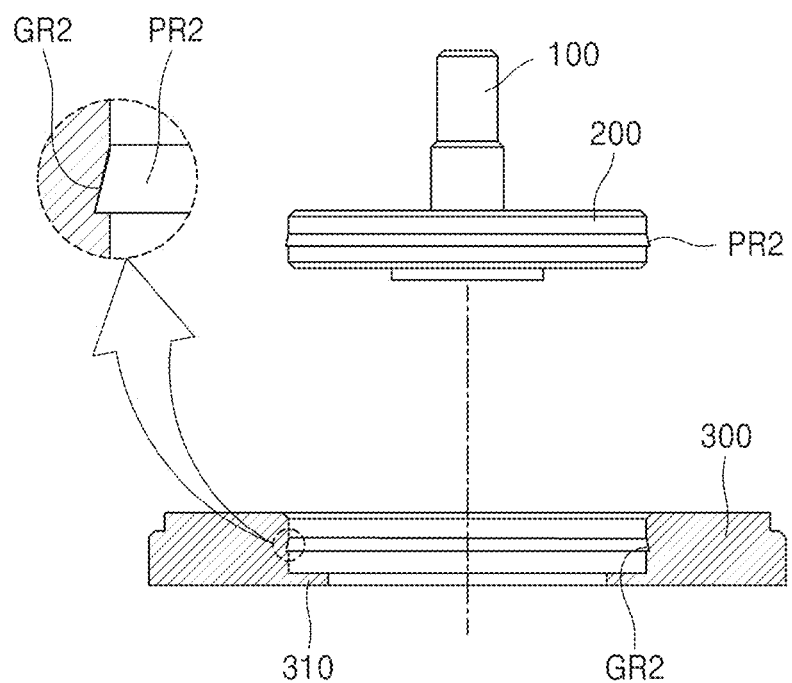

Meanwhile, referring to FIG. 12, the second protrusion PR2 may be disposed on an outer surface of the dielectric body 200 instead of the second groove GR2, and the second groove GR2 may be formed in an inner surface of the ground body 300 instead of the second protrusion PR2.

Such a coupling structure using the second protrusion PR2 and the second groove GR2 of FIG. 12 is different from that of FIG. 11 only in an arrangement position, and thus, detailed descriptions thereof will be omitted.

Next, the coupling structure using the second protrusion PR2 and the dielectric body 200 may be a structure in which the second protrusion PR2 is disposed on the inner peripheral surface of the ground body 300 and coupled to the outer peripheral surface of the dielectric body 200 in a press-fit manner.

Various embodiments of the second protrusion PR2 are as follows.

Figure 13:
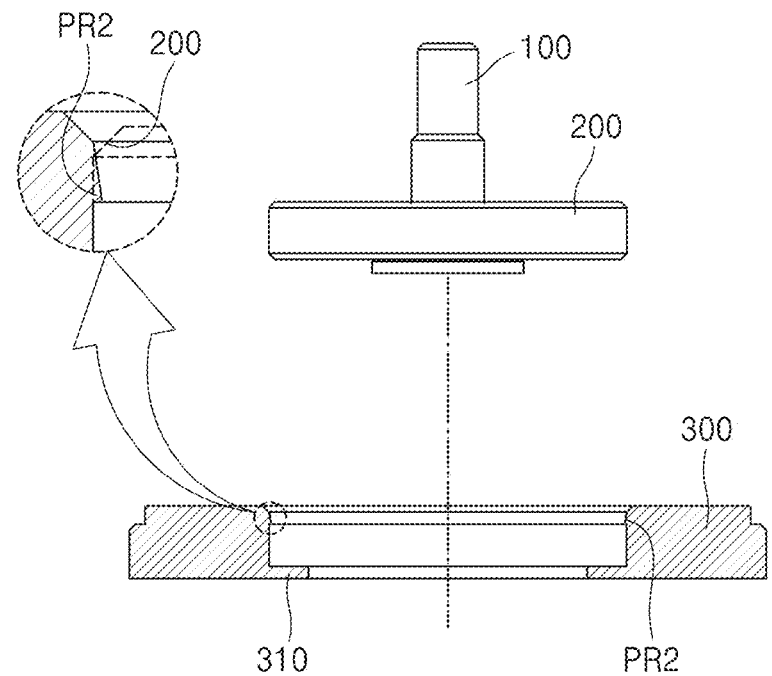

In one embodiment, referring to FIG. 13, the connector 10 may include the second protrusion PR2.

The second protrusion PR2 may be disposed to extend along the inner peripheral surface of the ground body 300 so that an inclined surface is formed.

The second protrusion PR2 may be coupled to the outer peripheral surface of the dielectric body 200 in a press-fit manner.

Next, the coupling structure using the second protrusion PR2 and the second stepped portion ST2 may be a structure in which the second protrusion PR2 is disposed on the inner peripheral surface of the ground body 300 and the second stepped portion ST2 is disposed on the outer peripheral surface of the dielectric body 200 so that the second protrusion PR2 is seated on the second stepped portion ST2.

Figure 14:
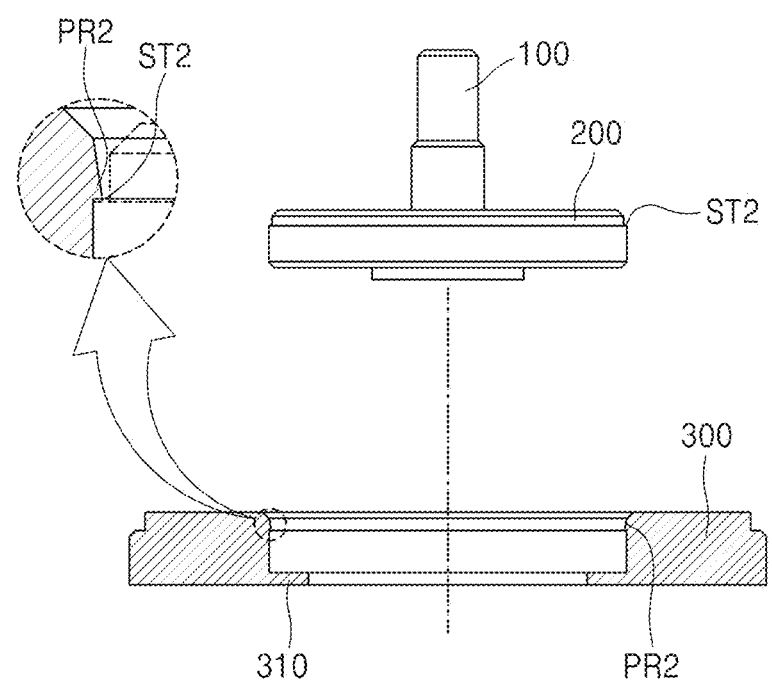

In another embodiment, referring to FIG. 14, the connector 10 may include the second stepped portion ST2 and the second protrusion PR2.

The second stepped portion ST2 may be disposed to be inserted along the outer peripheral surface of the dielectric body 200.

The second protrusion PR2 may be disposed to extend along the inner peripheral surface of the ground body 300 so that an inclined surface is formed.

The second protrusion PR2 may be seated on the second stepped portion ST2. For example, the dielectric body 200 slides along the inclined surface of the second protrusion PR2 to be inserted into the second opening OP2 of the ground body 300, and the second stepped portion ST2 is caught by the second protrusion PR2, thereby preventing the dielectric body 200 from being separated from the ground body 300.

As described above, the coupling structure of the second protrusion PR2 is formed, thereby improving a coupling between the dielectric body 200 and the ground body 300.

Figure 15:
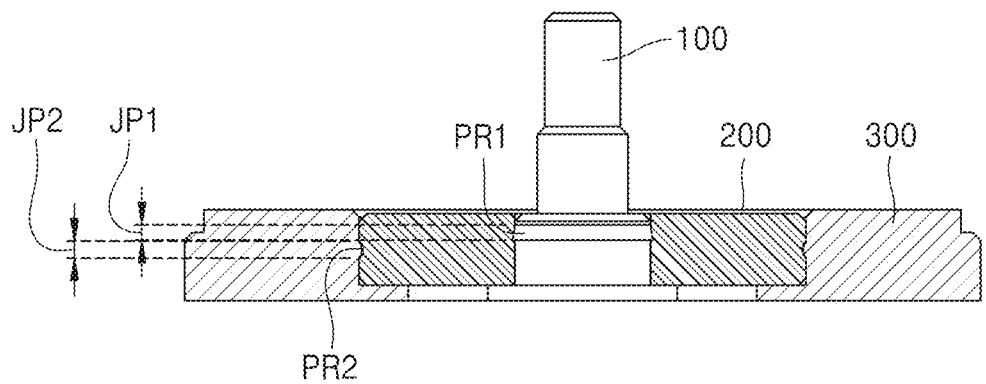
Figure 16:
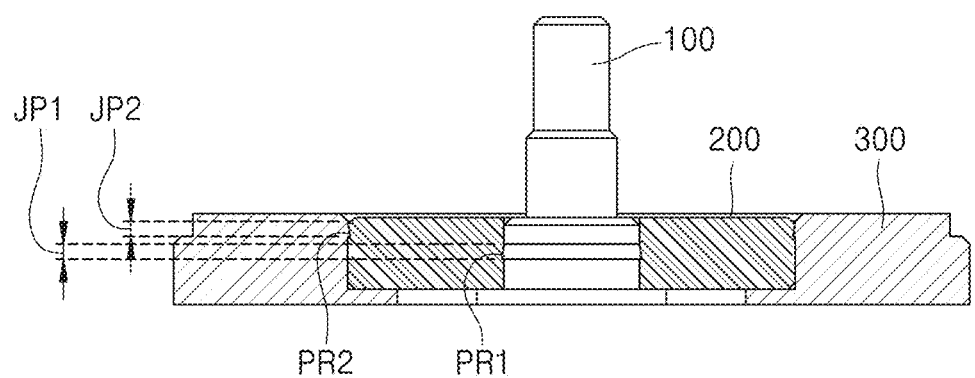

Referring to FIGS. 15 and 16, the first protrusion PR1 disposed on one of the inner peripheral surface of the dielectric body 200 and the outer peripheral surface of the connection pin 100 may be disposed at a different level from the second protrusion PR2 disposed on one of the inner peripheral surface of the ground body 300 and the outer peripheral surface of the dielectric body 200.

The connection pin 100 and the dielectric body 200 may have first coupling regions JP1 coupled by the first protrusion PR1 in a vertical direction of the connector 10.

The dielectric body 200 and the ground body 300 may have second coupling regions JP2 coupled by the second protrusion PR2 in the vertical direction of the connector 10.

The first coupling region JP1 and the second coupling region JP2 are positioned at different levels in the vertical direction of the connector 10. For example, the first coupling region JP1 and the second coupling region JP2 may not overlap each other in a horizontal direction of the connector 10.

Various embodiments of the first protrusion PR1 and the second protrusion PR2 are as follows.

In one embodiment, referring to FIG. 15, the first protrusion PR1 is disposed at a higher level than the second protrusion PR2 so that the first coupling region JP1 is positioned at a higher level than the second coupling region JP2.

In another embodiment, referring to FIG. 16, the first protrusion PR1 may be disposed at a lower level than the second protrusion PR2 so that the first coupling region JP1 may be positioned at a lower level than the second coupling region JP2.

As described above, since the first protrusion PR1 and the second protrusion PR2 are disposed at different levels, an impedance mismatch can be prevented, and the connector 10 can stably transmit high-frequency signals.

Referring to FIGS. 17A-17C and 18A-18C, the connector 10 may include a joint member MT.

The joint member MT may be inserted into the ground body 300 so that a lower surface thereof may support the dielectric body 200 and the ground body 300. For example, the joint member MT may be formed to have a diameter that is greater than that of the second opening OP2 and fixed to the ground body 300 in a press-fit manner.

The joint member MT is not limited to a specific shape and may have various shapes. For example, the joint member MT may have various shapes such as plate, stick, and ball shapes.

Various embodiments of the joint member MT are as follows.

Figure 17A:
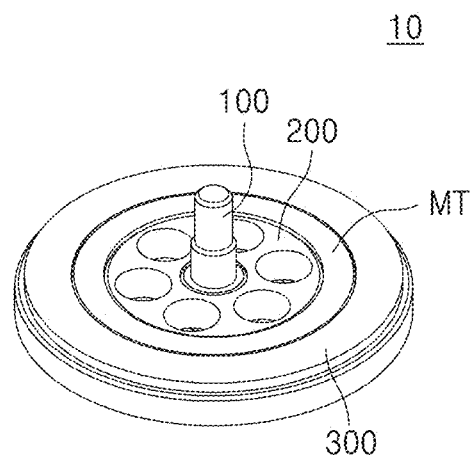
Figure 17B:
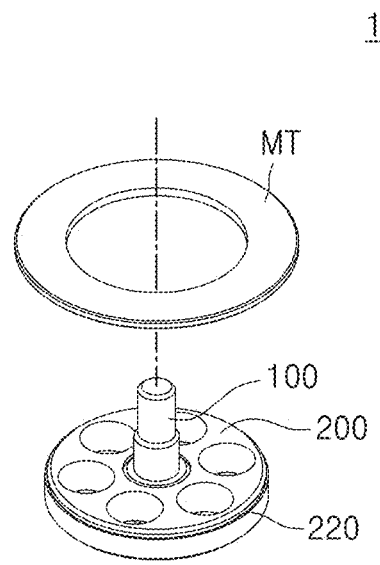
Figure 17C:
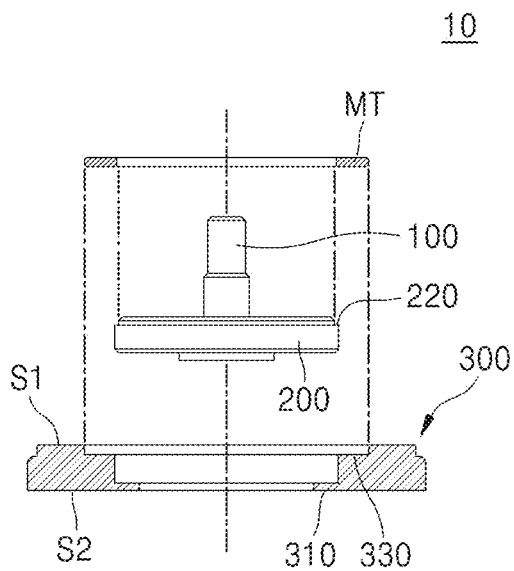

In one embodiment, referring to FIGS. 17A-17C, the joint member MT having an annular plate shape may be inserted into the ground body 300 so that the lower surface thereof may supports the dielectric body 200 and the ground body 300.

A portion of the joint member MT may be seated on a mounting portion 330 formed on the inner peripheral surface of the ground body 300.

The joint member MT may be seated on the mounting portion 330 so that an upper surface of the joint member MT may be positioned to be coplanar with the first surface S1 of the ground body 300.

Since the first surface S1 of the ground body 300 and the upper surface of the joint member MT have a flat shape, a wide contact area with the first board PB1 to be described below can be maintained, thereby stably maintaining a coupling between the connector 10 and the first board PB1.

The other portion of the joint member MT may support the upper surface of the dielectric body 200 or may be inserted into the dielectric body 200 and seated on a trench 220 formed in the outer peripheral surface of the dielectric body 200.

Figure 18A:
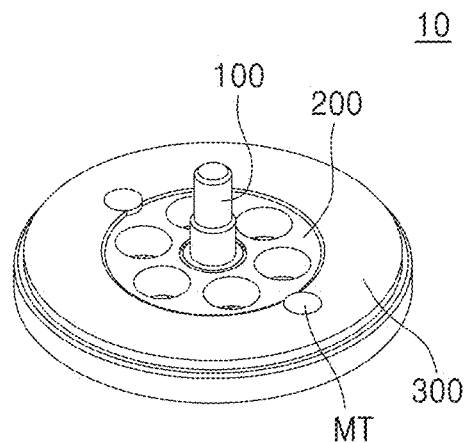
Figure 18B:
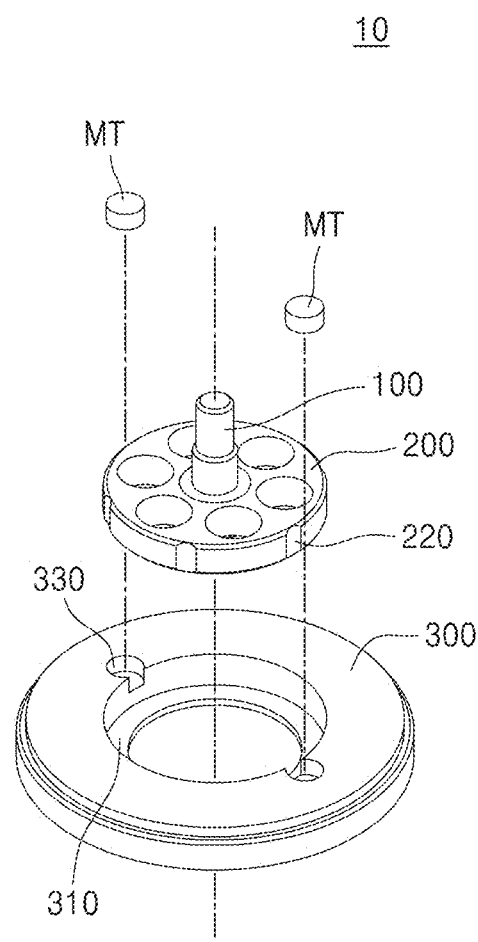
Figure 18C:
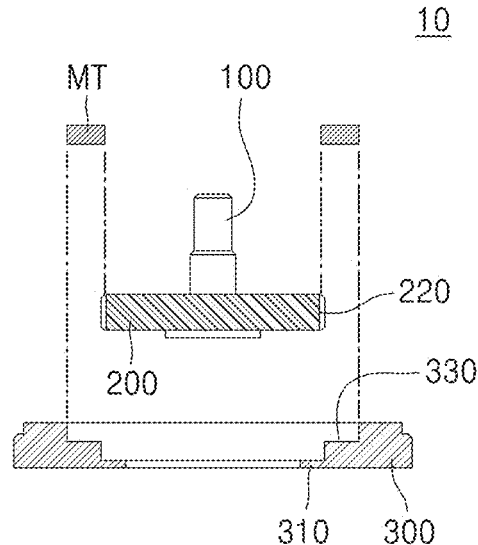
Figure 19A:
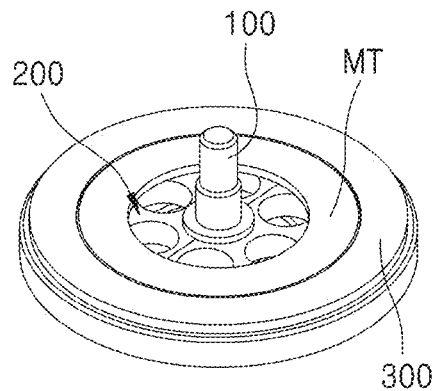
Figure 19B:
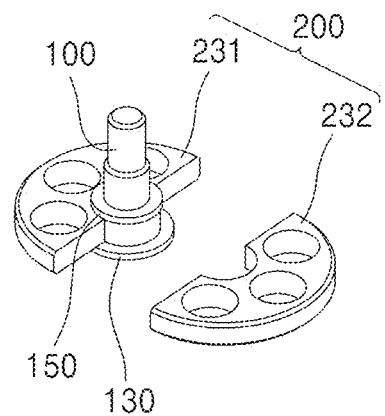
Figure 19C:
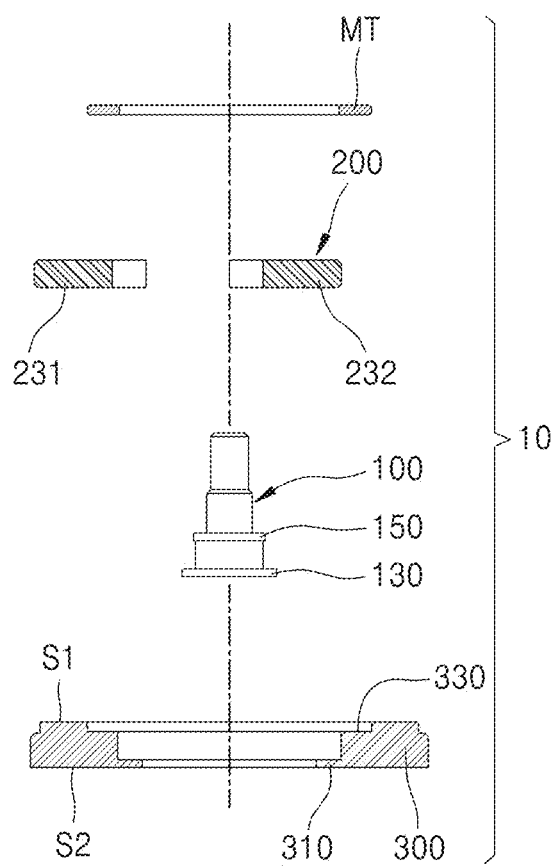

In another embodiment, referring to FIGS. 18A-18C, a plurality of joint members MT of which at least one pair face each other may be inserted into the ground body 300 so that lower surfaces thereof may support the dielectric body 200 and the ground body 300.

A portion of each of the plurality of joint members MT may be seated on each of a plurality of mounting portions 330 formed on the inner peripheral surface of the ground body 300.

The plurality of joint members MT may be seated on the plurality of mounting portions 330 so that upper surfaces of the joint members MT may be positioned to be coplanar with the first surface S1.

The other portion of each of the plurality of joint members MT may support the upper surface of the dielectric body 200 or may be inserted into the dielectric body 200 and seated on each of a plurality of trenches 220 formed in the outer peripheral surface of the dielectric body 200.

As described above, the joint member MT supports the dielectric body 200 and the ground body 300, thereby improving a coupling between the dielectric body 200 and the ground body 300.

Referring to FIGS. 19A-19C and 20A-20C, the dielectric body 200 may be formed by coupling a plurality of separate dielectric pieces to the connection pin 100.

In an embodiment of the plurality of dielectric pieces, the dielectric body 200 may include a first dielectric piece 231 and a second dielectric piece 232.

The first dielectric piece 231 and the second dielectric piece 232 may be coupled to the connection pin 100 to form the dielectric body 200.

Portions of the first dielectric piece 231 and the second dielectric piece 232 may be supported on surfaces corresponding to each other, and the other portions thereof may be supported on the outer peripheral surface of the connection pin 100 and coupled to the connection pin 100.

Referring to FIGS. 19A-19C and 20A-20C, the connection pin 100 may further include a second supporter 150.

The second supporter 150 may have a cross-sectional area that is different from that of the first opening OP1 and may be supported on the upper surface of the dielectric body 200.

Since the second supporter 150 has a cross-sectional area that is greater than that of the first opening OP1, an edge of the second supporter 150 may extend from the first opening OP1 so as to be supported on the dielectric body 200.

As described above, since the second supporter 150 supports the dielectric body 200, the connection pin 100 and the dielectric body 200 may stably maintain a coupled state.

Referring to FIGS. 19A-19C and 20A-20C, the second supporter 150 may be disposed to be vertically spaced apart from the contact portion 130.

The contact portion 130 may support the lower surface of the dielectric body 200, and the second supporter 150 may support the upper surface of the dielectric body 200.

Various embodiments of the contact portion 130 and the second supporter 150 are as follows.

In one embodiment, the contact portion 130 and the second supporter 150 have the same diameter, and edges of the first supporter 310 and the second supporter 150 support the dielectric body 200 in a perpendicular direction.

In another embodiment, the contact portion 130 may have a diameter that is greater than that of the second supporter 150, and the edges of the first supporter 310 and the second supporter 150 may support the dielectric body 200 in a diagonal direction.

As described above, since the contact portion 130 and the second supporter 150 support the dielectric body 200, the connection pin 100 and the dielectric body 200 may stably maintain a coupled state.

Figure 20A:
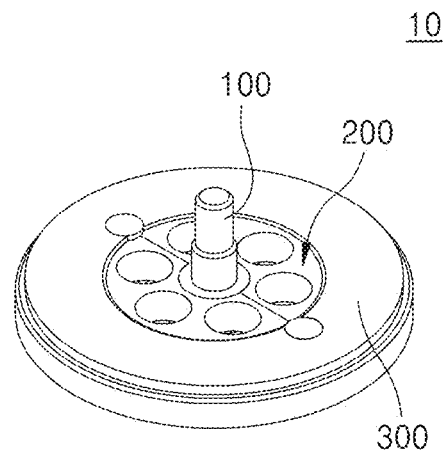
Figure 20B:
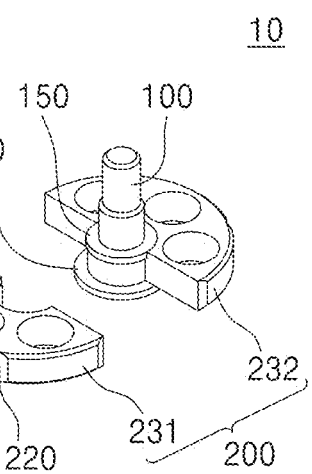
Figure 20C:
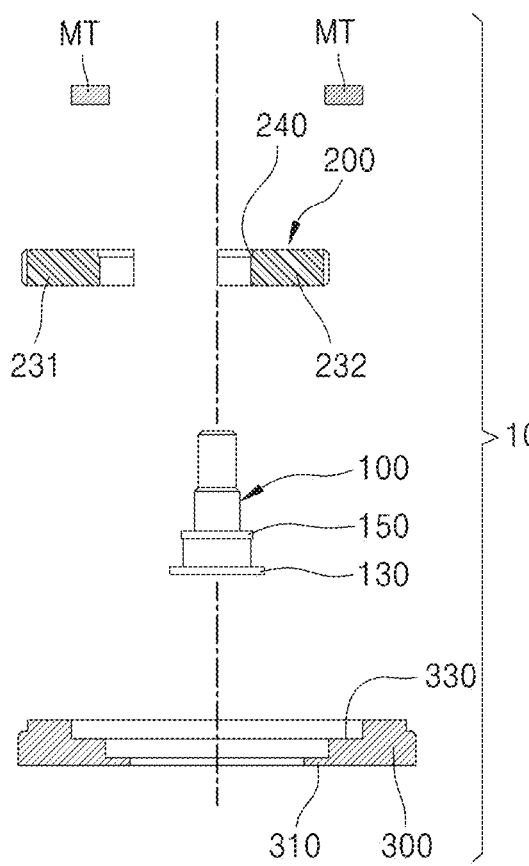

Referring to FIGS. 20A-20C, the dielectric body 200 may include an accommodation groove 240.

The accommodation groove 240 may form a space into which the second supporter 150 is inserted.

The second supporter 150 may be inserted into the accommodation groove 240 to not protrude from the dielectric body 200.

The second supporter 150 may be positioned at a lower level than the joint member MT.

As described above, since the second supporter 150 and the joint member MT are disposed at different levels, an impedance mismatch can be prevented, and the connector 10 can stably transmit high-frequency signals.

Referring to FIGS. 19A-19C and 20A-20C, the joint member MT may support the upper surface of the dielectric body 200 formed by coupling the plurality of separate dielectric pieces.

The second supporter 150 may support an inner side of the upper surface of the dielectric body 200, and the joint member MT may support an outer side of the upper surface of the dielectric body 200.

The second supporter 150 may be spaced apart from the joint member MT, and the dielectric body 200 may be exposed in a spacing space between the second supporter 150 and the joint member MT.

In order to secure a sufficient diameter of the joint member MT such that the joint member MT supports an upper surface of the ground body 300 and the upper surface of the dielectric body 200, the second supporter 150 may be formed to have a diameter that is less than that of the contact portion 130. Thus, the diameter of the joint member MT may be increased by as much as a decreased diameter of the second supporter 150.

As described above, since the second supporter 150 and the joint member MT support the upper surface of the dielectric body 200, the connection pin 100 and the dielectric body 200 may stably maintain a coupled state.

Hereinafter, a board connecting assembly 20 according to another aspect of the present invention will be mainly described.

Referring to FIGS. 21 to 26, the board connecting assembly 20 may include connectors 10, a first board PB1, and a fixing board FM.

The connector 10 may include a connection pin 100 which transmits high-frequency signals and a dielectric body 200 into which the connection pin 100 is inserted and may optionally include a ground body 300.

The first board PB1 may include signal lines electrically connected to the connector 10. For example, the first board PB1 may be a printed circuit board (PCB) or a flexible printed circuit board (FPCB). In addition, the signal line may be a line formed of a metal thin film printed on the first board PB1.

The first board PB1 may have a plurality of first insertion holes IH1 into which the connectors 10 are partially inserted.

The connection pin 100 of the connector 10 may be partially inserted into the first insertion hole IH1.

A first connection portion 120 of the connection pin 100 may be inserted into the first insertion hole IH1 and may be disposed to protrude from the first board PB1. For example, a height of the first board PB1 may be set to a first board height P1, and a height of the first connection portion 120 may be set to a third height H3 that is greater than the first board height P1 so that the first connection portion 120 may be partially exposed to the outside of the first board PB1.

The plurality of connectors 10 may be inserted into the fixing board FM.

Various embodiments of the fixing board FM are as follows.

In one embodiment, referring to FIGS. 21, 22, and 25, the fixing board FM may support a lower surface of the first board PB1.

The fixing board FM may fix positions, at which the plurality of connectors 10 are arranged, such that a portion of each connector 10 is accurately inserted into each of the plurality of first insertion holes IH1 of the first board PB1 and a board connection connector CON is accurately in contact with a contact portion 130.

In another embodiment, referring to FIGS. 23, 24, and 26, the fixing board FM may support the lower surface of the first board PB1 and support an upper surface of a second board PB2 to be described below.

The fixing board FM may fix positions, at which the plurality of connectors 10 are arranged, such that a portion of each connector 10 is accurately inserted into each of a plurality of second insertion holes IH2 of the second board PB2.

As described above, the fixing board FM stably fixes the positions of the plurality of connectors 10 so that a portion of each connector 10 can be accurately inserted into each of the plurality of insertion holes of the board.

The fixing board FM may be coupled to the ground body 300 or coupled to the dielectric body 200.

Various embodiments of the fixing board FM are as follows.

In one embodiment, referring to FIGS. 21 to 24, the fixing board FM may be in contact with and coupled to the ground body 300.

The fixing board FM may be formed of an insulating material having an electrical insulating property or a metal material being grounded to the ground body 300.

Figure 26:
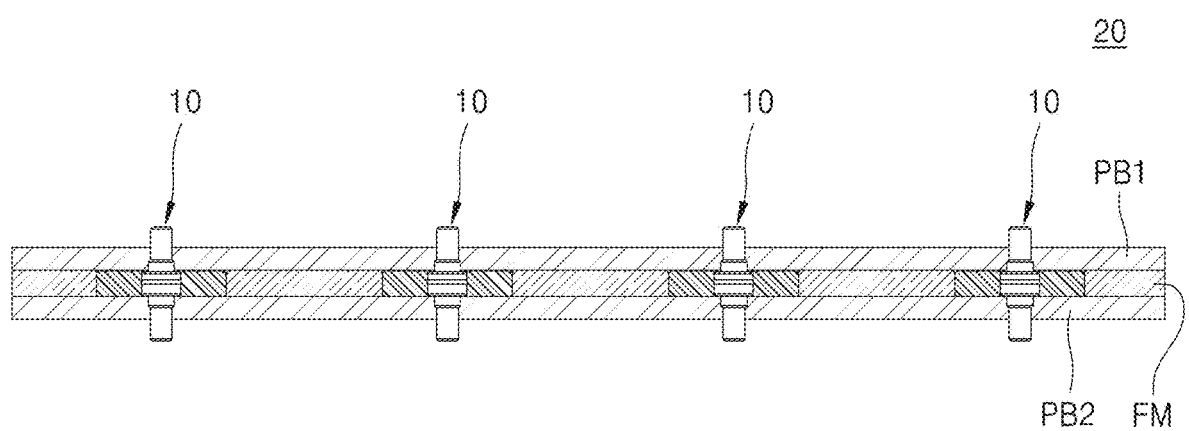

In another embodiment, referring to FIGS. 25 and 26, the fixing board FM may be in contact with and coupled to the dielectric body 200 instead of the ground body 300.

The fixing board FM may be formed of a metal material having electrical conductivity to be grounded in order to block external signal interference to the connection pin 100.

The fixing board FM may be grounded to the outside. For example, in order to block external signal interference, each of the plurality of connectors 10 should be individually grounded to the outside, but the plurality of connectors 10 may be collectively shielded by the fixing board FM grounded to the outside.

As described above, since the plurality of connectors 10 are collectively grounded, a configuration can be omitted in which each contact portion 130 is individually grounded, and thus, the board connecting assembly 20 can be compactly formed to increase space utilization.

The first connection portion 120, which is a portion inserted into the first insertion hole IH1, may be formed to have a diameter that is less than that of the first insertion hole IH1 so that the connection pin 100 may be fixed to the first board PB1 through soldering or an adapter connector (not shown). Alternatively, the first connection portion 120 may be formed to have a diameter that is greater than that of the first insertion hole IH1 so that the connection pin 100 may be fixed to the first board PB1 in a press-fit manner.

Various embodiments of the first connection portion 120 are as follows.

In one embodiment, the first connection portion 120 may be fixed by a connection pad PD installed through a method such as a soldering method.

Referring to FIGS. 22 and 24, a portion of the connection pin 100, which is inserted into the first insertion hole IH1, may be formed to have a diameter that is less than that of the first insertion hole IH1 so that the connection pin 100 may be fixed to the first board PB1 by the connection pad PD.

The first connection portion 120 may be divided into a first connection part 121 and a second connection part 122. The first connection part 121 may extend from a central portion 110, and the second connection part 122 may extend from the first connection part 121. When the first connection portion 120 is inserted into the first insertion hole IH1 of the first board PB1, a point at which the first connection part 121 and the second connection part 122 are connected may be disposed inside the first insertion hole IH1.

The second connection part 122 may be formed to have a diameter that is less than that of the first connection part 121.

Since the diameter of the second connection part 122 is less than that of the first connection part 121, the connection pad PD can be easily installed through a method such as a soldering method. For example, since the diameter of the second connection part 122 is less than that of the first connection part 121, a space between the second connection part 122 and the first insertion hole IH1 is further secured, and thus, solder sufficiently fills the secured space, thereby improving a coupling between the first board PB1 and the connector 10.

In another embodiment, the first connection portion 120 may be inserted into the adapter connector (not shown) coupled to the first insertion hole IH1 and thus may be fixed to the first board PB1.

The portion of the connection pin 100, which is inserted into the first insertion hole IH1, may be formed to have the diameter that is less than that of the first insertion hole IH1.

The adapter connector (not shown) having an insertion hole with a diameter that is less than that of the first insertion hole IH1 is inserted into and coupled to the first insertion hole IH1, and the first connection portion 120 may be inserted into the insertion hole of the adapter connector (not shown).

A material of the adapter connector (not shown) may be formed as a metal material having electrical conductivity. For example, the material of the adapter connector (not shown) may include at least one selected from among copper, brass, and beryllium copper (BeCu).

In another embodiment, a portion of the first connection portion 120, which is inserted into the first insertion hole IH1, may be formed to have a diameter that is greater than that of the first insertion hole IH1 so that the first connection portion 120 may be fixed to the first board PB1 in a press-fit manner.

A hole may be formed in the first connection portion 120 in a horizontal direction such that the portion of the first connection portion 120 inserted into the first insertion hole IH1 has elasticity. For example, the first connection portion 120 may have an elastic structure for a press-fit process.

The first connection portion 120 may be directly and fixedly inserted into the first insertion hole IH1 or may be fixedly inserted into the adapter connector (not shown) coupled to the first insertion hole IH1.

As described above, the first connection portion 120 is fixed in the first insertion hole IH1, thereby improving a coupling between the first connection portion 120 and the first board PB1.

Referring to FIGS. 21 and 25, the board connecting assembly 20 may further include the board connection connector CON.

The board connection connector CON may be in contact with the contact portion 130 so that the first board PB1 and the board connection connector CON may be electrically connected through the connector 10. In this case, since the contact portion 130 has a first diameter D1 that is greater than that of the first opening OP1, the board connection connector CON may be in stable contact with the contact portion 130.

The board connection connector CON may be grounded by being in contact with the ground body 300 or the fixing board FM.

Various embodiments of the board connection connector CON are as follows.

In one embodiment, referring to FIG. 21, when the board connection connector CON is grounded by being in contact with the ground body 300, the ground body 300 and the board connection connector CON may maintain a stable contact because a second surface S2 of the ground body 300 has a flat shape.

In another embodiment, referring to FIG. 25, when the board connection connector CON is grounded by being in contact with the fixing board FM, the fixing board FM and the board connection connector CON may maintain a stable contact because a lower surface of the fixing board FM has a flat shape.

As such, when the board connection connector CON is in direct contact with the lower surface of the first board PB1, high-frequency signal transmission performance may be degraded due to external signal interference, but since the first board PB1 and the board connection connector CON are electrically connected through the connector 10, high-frequency signal transmission performance may be maintained.

An upper portion of the board connection connector CON may be in contact with the ground body 300 or the fixing board FM, and a lower portion of the board connection connector CON may be coupled to a third board (not shown), on which signal lines are formed, so that the first board PB1 and the third board (not shown) may be electrically connected to the connector 10 through the board connection connector CON. For example, like connectors disclosed in KR10-2118829 B 1 and KR10-2163379 B 1, the board connection connector CON may be a connector that has vertical elasticity and is in contact with a board.

Referring to 23, 24, and 26, the board connecting assembly 20 may further include the second board PB2.

The second board PB2 may include signal lines electrically connected to the connector 10. For example, the second board PB2 may be a PCB or an FPCB. Ion addition, the signal line may be a line formed of a metal thin film printed on the second board PB2.

The second board PB2 may have the plurality of second insertion holes IH2 into which the connectors 10 are partially inserted.

The connection pin 100 of the connector 10 may be partially inserted into the second insertion hole IH2.

A second connection portion 140 of the connection pin 100 may be inserted into the second insertion hole IH2 and may be disposed to protrude from the second board PB2. For example, referring to FIG. 24, a height of the second board PB2 may be set to a second board height P2, and a height of the second connection portion 140 may beset to a fourth height H4 greater than the second board height P2 so that the second connection portion 140 may be partially exposed to the outside of the second board PB2.

The second connection portion 140, which is a portion inserted into the second insertion hole IH2, may be formed to have a diameter that is less than that of the second insertion hole IH2 so that the connection pin 100 may be fixed to the second board PB2 through soldering or an adapter connector (not shown). Alternatively, the second connection portion 140 may be formed to have a diameter that is greater than that of the second insertion hole IH2 so that the connection pin 100 may be fixed to the second board PB2 in a press-fit manner.

An embodiment in which the second connection portion 140 is fixed to the second board PB2 is the same as an embodiment in which the first connection portion 120 is fixed to the first board PB1, and thus, detailed descriptions thereof will be omitted.

As described above, the second connection portion 140 is fixed in the second insertion hole IH2, thereby improving a coupling between the second connection portion 140 and the second board PB2.

Referring to FIGS. 22 and 24, since a first surface S1 and the second surface S2 have a flat shape, the ground body 300 may maintain a stable contact with the board.

Various embodiments of the first surface S1 and the second surface S2 are as follows.

In one embodiment, referring to FIG. 22, the first surface S1 of the ground body 300 may be supported on the lower surface of the first board PB1. For example, since the first surface S1 of the ground body 300 has the flat shape, a wide contact area with the first board PB1 can be maintained, thereby stably maintaining a coupling between the connector 10 and the first board PB1.

In another embodiment, referring to FIG. 24, the second surface S2 of the ground body 300 may support the upper surface of the second board PB2. For example, since the second surface S2 of the ground body 300 has the flat shape, a wide contact area with the second board PB2 can be maintained, thereby stably maintaining a coupling between the connector 10 and the second board PB2.

As described above, the ground body 300 can maintain a wide contact area with the board so that a coupling between the connector 10 and the board may be improved.

Referring to FIGS. 22 and 24, the dielectric body 200 of the connector 10 may be supported on the lower surface of the first board PB1. Since an upper surface of the dielectric body 200 may be positioned to be coplanar with the first surface S1, the dielectric body 200 may also be supported on the first board PB1 together with the ground body 300. For example, the ground body 300 may have a first height H1 which is a distance between the first surface S1 and the second surface S2. The first height H1 may be set to be greater than or equal to a second height H2 so that the dielectric body 200 is included in the ground body 300.

Since the second height H2 of the dielectric body 200 is set to be less than or equal to the first height H1 of the ground body 300, the dielectric body 200 does not protrude from the ground body 300.

As described above, since the dielectric body 200 and the ground body 300 are supported together on the board, thereby improving a coupling between the connector 10 and the board.

Figure 27:
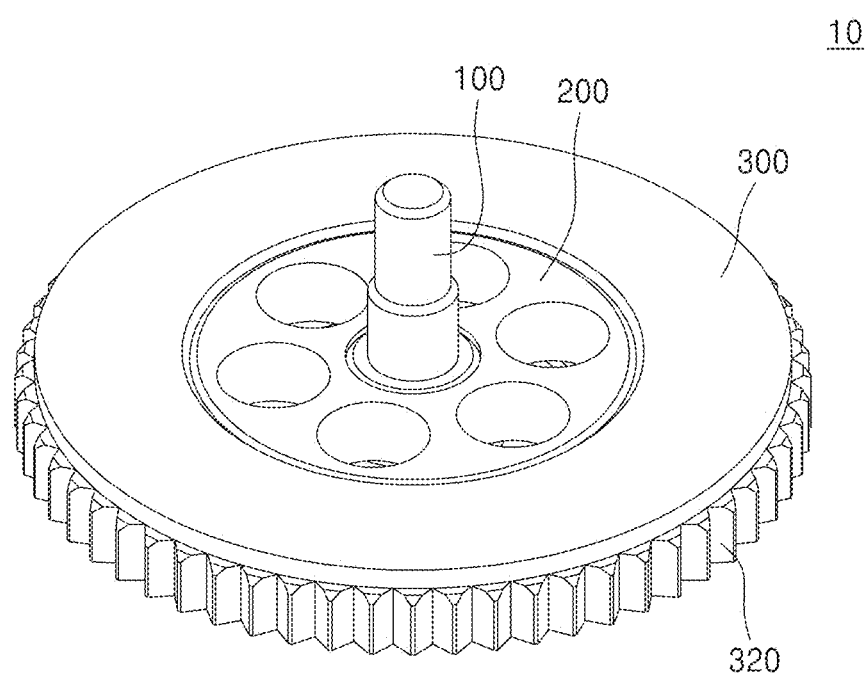
FIG. 27 is a perspective view illustrating a connector further including a supporting protrusion.

Referring to FIG. 27, the ground body 300 may include supporting protrusions 320.

The supporting protrusion 320 may be disposed on an outer peripheral surface of the ground body 300 and fixed to the fixing board FM in a press-fit manner.

The supporting protrusions 320 may have an uneven shape.

The plurality of supporting protrusions 320 may have a shape surrounding the outer peripheral surface of the ground body 300.

Although FIG. 27 illustrates an example in which the supporting protrusions 320 vertically extend and have the same shape, but the present invention is not limited thereto, and the supporting protrusions 320 may have various shapes. For example, the supporting protrusions 320 may have different protrusion amounts or have a shape in which only some thereof protrude in a circumferential direction.

As described above, the supporting protrusion 320 is fixed to the fixing board FM, thereby improving a coupling between the ground body 300 and the fixing board FM.

Although not shown in the drawings, in the fixing board FM and the dielectric body 200, a coupling structure using a third protrusion (not shown) and a third groove (not shown) may be formed, a coupling structure using the third protrusion (not shown) and the dielectric body 200 may be formed, or a coupling structure using the third protrusion (not shown) and a third stepped portion (not shown) may be formed.

Various embodiments of the coupling structure of the third protrusion (not shown) are as follows.

In one embodiment, the coupling structure using the third protrusion (not shown) and the third groove (not shown) may be a structure in which the third protrusion (not shown) is disposed on one of an inner peripheral surface of the fixing board FM and an outer peripheral surface of the dielectric body 200 and the third groove (not shown) is formed in the other of the inner peripheral surface of the fixing board FM and the outer peripheral surface of the dielectric body 200 so that the third protrusion (not shown) and the third groove (not shown) are coupled.

In another embodiment, the coupling structure using the third protrusion (not shown) and the dielectric body 200 may be a structure in which the third protrusion (not shown) is disposed on the inner peripheral surface of the fixing board FM and coupled to the outer peripheral surface of the dielectric body 200 in a press-fit manner.

In still another embodiment, the coupling structure using the third protrusion (not shown) and the third stepped portion (not shown) may be a structure in which the third protrusion (not shown) is disposed on the inner peripheral surface of the fixing board FM and the third stepped portion (not shown) is disposed on the outer peripheral surface of the dielectric body 200 so that the third protrusion (not shown) is seated on the third stepped portion (not shown).

The coupling structure of the third protrusion (not shown) according to the above-described embodiment is different from the coupling structure of the second protrusion PR2 of FIGS. 8 17C only in a disposed component and is similar thereto in a shape, and thus, detailed descriptions thereof will be omitted.

As described above, the coupling structure of the third protrusion (not shown) is formed, thereby improving a coupling between the dielectric body 200 and the fixing board FM.

Although not shown in the drawings, a first protrusion PR1 disposed on one of an inner peripheral surface of the dielectric body 200 and an outer peripheral surface of the connection pin 100 may be disposed at a different level from the third protrusion (not shown) disposed on one of an inner peripheral surface of the ground body 300 and the outer peripheral surface of the dielectric body 200.

A position of the third protrusion (not shown) with respect to the first protrusion PR1 is different from a position of the second protrusion PR2 with respect to the first protrusion PR1 of FIGS. 15 and 16 only in a disposed component and is similar thereto in a shape, and thus, detailed descriptions thereof will be omitted.

As described above, since the first protrusion PR1 and the third protrusion (not shown) are disposed at different levels, an impedance mismatch can be prevented, and the connector 10 can stably transmit high-frequency signals.

Although the present invention has been described with reference to the embodiments shown in the drawings, this is merely exemplary, and it should be understood by those skilled in the art that various changes and modifications are possible from the embodiments. Accordingly, the true technical protection scope of the present invention should be determined by the technical spirit of the appended claims.

A modification of the present invention may include, for example, a connection pin 100 and a dielectric body 200 as a first embodiment of a connector 10.

In addition, a modification of the present invention may include a connection pin 100, a dielectric body 200, and a ground body 300 as a second embodiment of a connector 10.

Furthermore, a modification of the present invention may include a connector 10, a first board PB1, and a fixing board FM as a first embodiment of a board connecting assembly 20.

In addition, a modification of the present invention may include a connector 10, a first board PB1, a fixing board FM, and a second board PB2 as a second embodiment of a board connecting assembly 20.

Furthermore, a modification of the present invention may include a connector 10, a first board PB1, a fixing board FM, and a ground body 300 as a third embodiment of a board connecting assembly 20.

In addition, a modification of the present invention may include a connector 10, a first board PB1, a fixing board FM, a ground body 300, and a second board PB2 as a fourth embodiment of a board connecting assembly 20.

[Descriptions of Reference Numerals]

| | |
|---|---|
| 10: connector | 20: board connecting assembly |
| 100: connection pin | 110: central portion |
| 120: first connection portion | 121: first connection portion |
| 122: second connection portion | 130: contact unit |
| 140: second connection portion | 150: second supporter |
| 200: dielectric body | 210: dielectric hole |
| 220: trench | 231: first dielectric piece |
| 232: second dielectric piece | 240: accommodation groove |
| 300: ground body | 310: first supporter |
| 320: supporting protrusion | 330: mounting portion |
| S1: first surface | S2: second surface |
| PB1: first board | PB2: second board |
| IH1: first insertion hole | IH2: second insertion hole |
| P1: first board height | P2: second board height |
| H1: first height | H2: second height |
| H3: third height | H4: fourth height |
| FM: fixing board | CON: board connection connector |
| OP1: first opening | OP2: second opening |
| D1: first diameter | D2: second diameter |
| D3: third diameter | PR1: first protrusion |
| PR2: second protrusion | GR2: second groove |
| ST2: second stepped portion | MT: joint member |

We claim:
1. A connector, comprising:
a connection pin partially inserted into a board to transmit a high-frequency signal;
a dielectric body including a first opening into which the connection pin is inserted;
a ground body including a second opening into which the dielectric body is inserted and including a first surface and a second surface, which face away from each other, having a flat shape; and
a first supporter which protrudes from an inner peripheral surface of the ground body toward a center of the second opening and supports a lower surface of the dielectric body,
wherein the connection pin includes a central portion, which is disposed in the first opening of the dielectric body, and a first connection portion extending upward from the central portion and protruding upward from the dielectric body,
wherein a diameter of the central portion is greater than that of the first connection portion,
wherein the connection pin further includes a contact portion which includes a cross-sectional area that is different from that of the first opening and is supported on athe lower surface of the dielectric body,
wherein the contact portion includes at least a portion inserted into an accommodation space defined by the first supporter and the dielectric body, and is spaced apart from the first supporter,
wherein a lower surface of the first supporter is disposed to be coplanar with a lower surface of the contact portion, and
wherein a height of the first supporter is same as a height of the contact portion.

2. The connector of claim 1, wherein the connection pin further includes a second connection portion which extends downward from the central portion and protrudes downward from the dielectric body.

3. The connector of claim 1, further comprising a first protrusion disposed on an outer peripheral surface of the central portion and supported on an inner peripheral surface of the dielectric body.

4. The connector of claim 1, wherein the dielectric body includes a plurality of dielectric holes which pass vertically through the dielectric body and include an open upper surface and an open lower surface or a plurality of dielectric grooves of which at least one of an upper surface and a lower surface is open.

5. The connector of claim 1, further comprising:
a second protrusion disposed on one of the inner peripheral surface of the ground body or an outer peripheral surface of the dielectric body; and
a second groove formed in the other of the inner peripheral surface of the ground body or the outer peripheral surface of the dielectric body and coupled to the second protrusion.

6. The connector of claim 1, further comprising a second protrusion disposed on the inner peripheral surface of the ground body and coupled to an outer peripheral surface of the dielectric body in a press-fit manner.

7. The connector of claim 1, further comprising:
a second protrusion disposed on the inner peripheral surface of the ground body; and
a second stepped portion which is disposed on an outer peripheral surface of the dielectric body and on which the second protrusion is seated.

8. The connector of claim 1, further comprising:
a first protrusion disposed on any one of an inner peripheral surface of the dielectric body or an outer peripheral surface of the connection pin; and
a second protrusion disposed on any one of the inner peripheral surface of the ground body or the outer peripheral surface of the dielectric body,
wherein the first protrusion and the second protrusion are disposed at different levels.

9. The connector of claim 1, further comprising a joint member which is inserted into the ground body and includes a lower surface supporting the dielectric body and the ground body.

10. The connector of claim 9, further comprising at least one mounting portion which is formed on the inner peripheral surface of the ground body and on which a portion of the joint member is seated.

11. The connector of claim 10, further comprising at least one trench which is formed in an outer circumferential surface of the dielectric body and in which another portion of the joint member is seated.

12. The connector of claim 9, wherein the joint member is provided as a plurality of joint members of which at least one pair face each other.

13. The connector of claim 1, wherein the dielectric body is formed by coupling a plurality of separate dielectric pieces to the connection pin.

14. The connector of claim 13, wherein the connection pin further includes:
a second supporter which is vertically spaced apart from the contact portion, includes a cross-sectional area that is different from that of the first opening, and is supported on an upper surface of the dielectric body.

15. The connector of claim 14, wherein the dielectric body further includes an accommodation groove for forming a space into which the second supporter is inserted.

* * * * *